United States Patent
Yasuda

(10) Patent No.: US 10,819,295 B2
(45) Date of Patent: Oct. 27, 2020

(54) SEMICONDUCTOR DEVICE AND MEMORY SYSTEM

(71) Applicant: TOSHIBA MEMORY CORPORATION, Minato-ku (JP)

(72) Inventor: Yohei Yasuda, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/557,019

(22) Filed: Aug. 30, 2019

(65) Prior Publication Data

US 2020/0266783 A1   Aug. 20, 2020

(30) Foreign Application Priority Data

Feb. 19, 2019 (JP) ................. 2019-027851

(51) Int. Cl.
  *G11C 7/00* (2006.01)
  *H03F 3/45* (2006.01)
  *H03K 19/0185* (2006.01)
  *G11C 7/10* (2006.01)

(52) U.S. Cl.
  CPC ....... *H03F 3/45219* (2013.01); *G11C 7/1078* (2013.01); *H03F 3/45264* (2013.01); *H03F 3/45273* (2013.01); *H03K 19/018528* (2013.01)

(58) Field of Classification Search
  CPC ..... G11C 11/4091; G11C 7/065; G11C 7/062; G11C 7/06; G11C 7/067
  USPC ........................................ 365/205, 207, 208
  See application file for complete search history.

(56) References Cited

U.S. PATENT DOCUMENTS

| | | | |
|---|---|---|---|
| 8,575,969 B2 | 11/2013 | Sakakibara | |
| 8,917,562 B2* | 12/2014 | Wang ................. | G11C 13/0004 365/189.15 |
| 8,994,452 B2 | 3/2015 | Kim et al. | |
| 9,355,734 B2* | 5/2016 | Tran ..................... | G11C 13/004 |
| 9,571,101 B2 | 2/2017 | Watanabe et al. | |
| 9,634,629 B2 | 4/2017 | Watanabe et al. | |

FOREIGN PATENT DOCUMENTS

| | | |
|---|---|---|
| JP | 4724670 B2 | 7/2011 |
| JP | 2012-253404 A | 12/2012 |

* cited by examiner

*Primary Examiner* — Son T Dinh
(74) *Attorney, Agent, or Firm* — Oblon, McClelland, Maier & Neustadt, L.L.P.

(57) ABSTRACT

According to one embodiment, there is provided a semiconductor device comprising a first differential amplifier circuit. The first differential amplifier circuit includes a first transistor, a second transistor, a third transistor, a fourth transistor, a fifth transistor, and a sixth transistor. The second transistor's gate and drain are connected to the first transistor. The third transistor is diode-connected through the first transistor or diode-connected without passing through the first transistor. The fourth transistor is diode-connected through the second transistor or diode-connected without passing through the second transistor. The fifth transistor forms a first current mirror circuit with the third transistor. The sixth transistor is connected to a drain of the first transistor in parallel with the third transistor and forms a second current mirror circuit with the fifth transistor.

20 Claims, 16 Drawing Sheets

SEMICONDUCTOR DEVICE AND MEMORY SYSTEM

CROSS-REFERENCE TO RELATED APPLICATIONS

This application is based upon and claims the benefit of priority from Japanese Patent Application No. 2019-027851, filed on Feb. 19, 2019; the entire contents of which are incorporated herein by reference.

FIELD

Embodiments described herein relate generally to a semiconductor device and a memory system

BACKGROUND

In a semiconductor device including a differential amplifier circuit which receives an input signal and a reference signal, respectively, by a pair of transistors constituting a differential pair, respectively, a power supply voltage is used to amplify a difference between the input signal and the reference signal to generate an output signal. At this time, it is desirable to speed up an operation of the differential amplifier circuit.

DETAILED DESCRIPTION

Figure 1:
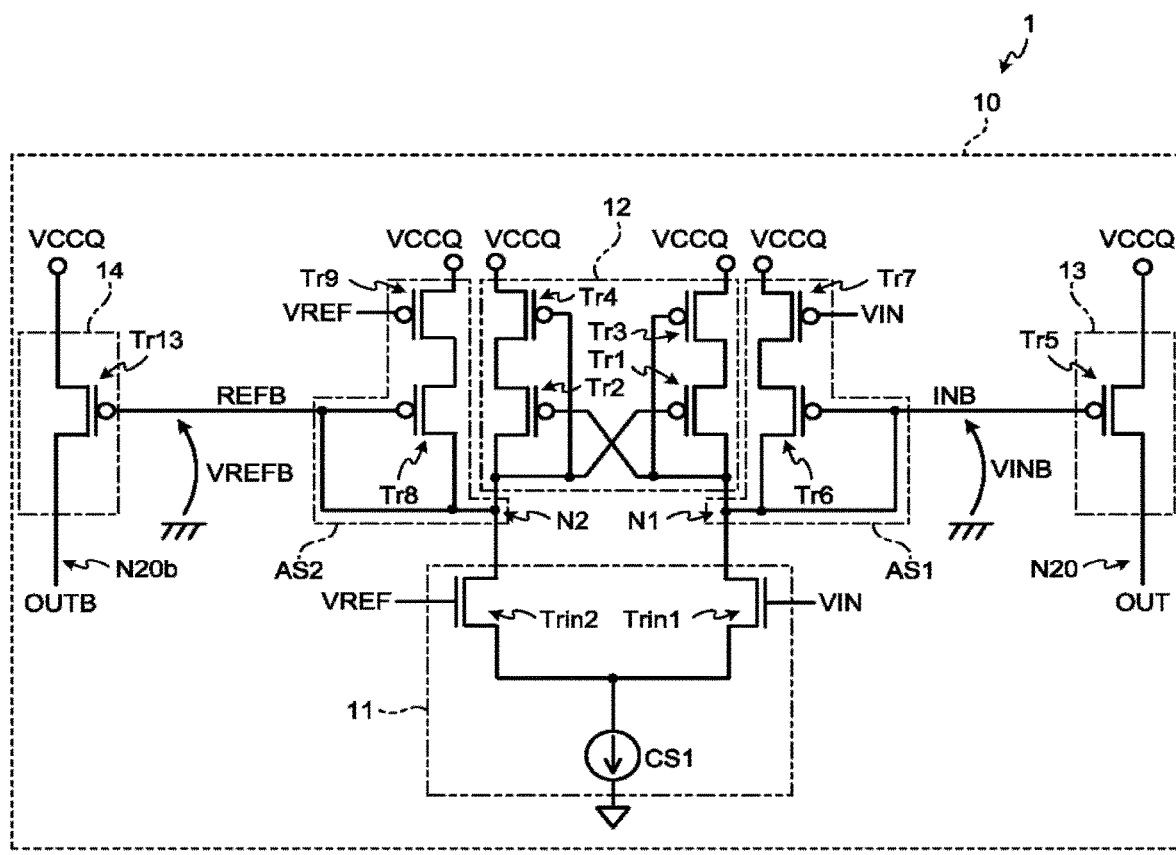
FIG. 1 is a circuit diagram illustrating a configuration of a semiconductor device according to a first embodiment.

In general, according to one embodiment, there is provided a semiconductor device comprising a first differential amplifier circuit. The first differential amplifier circuit includes a first transistor, a second transistor, a third transistor, a fourth transistor, a fifth transistor, and a sixth transistor. The second transistor's gate and drain are connected to the first transistor. The third transistor is diode-connected through the first transistor or diode-connected without passing through the first transistor. The fourth transistor is diode-connected through the second transistor or diode-connected without passing through the second transistor. The fifth transistor forms a first current mirror circuit with the third transistor. The sixth transistor is connected to a drain of the first transistor in parallel with the third transistor and forms a second current mirror circuit with the fifth transistor.

Exemplary embodiments of a semiconductor device will be explained below in detail with reference to the accompanying drawings. The present invention is not limited to the following embodiments.

First Embodiment

A semiconductor device according to a first embodiment includes a differential amplifier circuit. The differential amplifier circuit receives an input signal and a reference signal by a pair of transistors that constitute a differential pair. The differential amplifier circuit amplifies a difference between the input signal and the reference signal using a power supply voltage to generate an output signal. The semiconductor device including the differential amplifier circuit is sometimes used as a receiver in a high-speed interface of a semiconductor memory. At this time, it is desirable to speed up an operation of the differential amplifier circuit.

For example, in the differential amplifier circuit, amplitudes of two nodes on an output side can be suppressed by a circuit (cross-coupled circuit) in which a diode-connected transistor (diode load) is connected in parallel with each of two transistors of which gate and drain are cross-coupled. With this configuration, charging and discharging can be completed within a cycle at the two nodes on the output side even in the high-speed operation, inter-symbol interference (ISI) can be suppressed, and deterioration of valid window in the waveform can be reduced.

In addition, there is a case where assist circuits to which diode-connected transistors (diode load) are connected in parallel with configurations in which a diode-connected transistor and a transistor that receives an input signal at a gate are vertically stacked are provided on the input signal side and the reference signal side in the differential amplifier circuit. With these assist circuits, a mirror ratio of a current mirror can be changed in response to the input signal, and the differential amplifier circuit can be operated at a high speed. That is, it is possible to increase a gain of the entire differential amplifier circuit with the effect of the assist circuit, which leads to speed-up of the differential amplifier circuit.

Both the cross-coupled circuit and the assist circuit can contribute to suppressing an amplitude of an internal node of the differential amplifier circuit and completing the charging and discharging of the internal node in a short time. As a result, it is considered that the differential amplifier circuit that responds at a high speed can be configured using both the cross-coupled circuit and the assist circuit.

However, since these circuits are connected in parallel with the diode-connected transistors (diode loads), the amplitude of the internal node becomes too small in some cases. For example, when the input signal becomes an H level, power to charge the internal node becomes strong, and thus, a signal amplitude (a difference between the H level and an L level) of the internal node becomes too small in some cases. That is, if the signal amplitude of the internal node becomes too small, the gain of the differential amplifier circuit decreases, and there is a possibility that variations in the transistor at a mirror destination are emphasized so that it is difficult to obtain the accuracy necessary for the high-speed operation. Thus, it is desirable to control the signal amplitude of the internal node to the appropriate magnitude in order to realize the high-speed operation of the differential amplifier circuit.

Therefore, the cross-coupled circuit and the assist circuit are combined to remove the diode-connected transistor (diode load) in the differential amplifier circuit of the semiconductor device in the first embodiment, thereby achieving optimization of the signal amplitude of the internal node and speed-up of the differential amplifier circuit accompanying the optimization.

Specifically, a semiconductor device 1 can be configured as illustrated in FIG. 1. FIG. 1 is a diagram illustrating a configuration of the semiconductor device 1.

The semiconductor device 1 includes a differential amplifier circuit 10. The semiconductor device 1 may use the differential amplifier circuit 10 as a single input/single output differential amplifier circuit. An input signal VIN is input to the differential amplifier circuit 10 as a single input. The differential amplifier circuit 10 receives the input signal VIN and a reference signal VREF at a pair of transistors Trin1 and Trin2 that constitute a differential pair. The differential amplifier circuit 10 amplifies a difference between the input signal VIN and the reference signal VREF using a power supply voltage VCCQ to generate output signals OUT and OUTB. The output signal OUT and the output signal OUTB can have levels logically inverted to each other. The differential amplifier circuit 10 outputs the output signal OUT as a single output.

The differential amplifier circuit 10 includes a differential circuit 11, a load circuit 12, a transfer circuit 13, a transfer circuit 14, an assist circuit AS1, and an assist circuit AS2. The differential circuit 11 is arranged between a ground potential and the load circuit 12. The load circuit 12 is arranged between the differential circuit 11 and a power supply potential VCCQ. The load circuit 12 is configured using a circuit (cross-coupled circuit) in which gates and drains of two transistors are cross-coupled. The assist circuit AS1 is arranged between the load circuit 12 and the transfer circuit 13. The assist circuit AS2 is arranged between the load circuit 12 and the transfer circuit 14.

The transfer circuit 13 includes a transistor Tr5. The transistor Tr5 can be configured using a PMOS transistor. A gate of the transistor Tr5 is connected to the assist circuit AS1 through a bias line INB. A drain of the transistor Tr5 is connected to a node N20, and a source is connected to the power supply potential VCCQ.

The transfer circuit 14 includes a transistor Tr13. The transistor Tr13 can be configured using a PMOS transistor. A gate of the transistor Tr13 is connected to the assist circuit AS2 through a bias line REFB. A drain of the transistor Tr13 is connected to a node N20b, and a source is connected to the power supply potential VCCQ.

The differential circuit 11 includes the transistor Trin1, the transistor Trin2, and a current source CS1. The transistor Trin1 and the transistor Trin2 form the differential pair. Each of the transistor Trin1 and the transistor Trin2 can be configured using an NMOS transistor. The transistor Trin1 receives the input signal VIN at a gate, and has a drain electrically connected to a node N1 and a source electrically connected to one end of the current source CS1. The transistor Trin2 receives the reference signal VREF at a gate, and has a drain electrically connected to a node N2 and a source electrically connected to the one end of the current source CS1. The other end of the current source CS1 is electrically connected to a ground potential.

The load circuit 12 includes a transistor Tr1, a transistor Tr2, a transistor Tr3, and a transistor Tr4. The transistor Tr1 and the transistor Tr2 have gates and drains cross-coupled to each other. The transistor Tr3 is connected in series to the transistor Tr1 and is diode-connected through the transistor Tr1. The transistor Tr4 is connected in series to the transistor Tr2, and is diode-connected through the transistor Tr2. Each of the transistor Tr1, the transistor Tr2, the transistor Tr3, and the transistor Tr4 can be formed using a PMOS transistor.

The transistor Tr1 has the gate connected to a gate of the transistor Tr4 and the drain of the transistor Tr2, a source connected to a drain of the transistor Tr3, and a drain connected to the node N1.

The transistor Tr2 has a gate connected to a gate of the transistor Tr3 and the drain of the transistor Tr1, a source connected to a drain of the transistor Tr4, and the drain connected to the node N2.

The transistor Tr3 has the gate connected to the gate of the transistor Tr2 and the drain of the transistor Tr1, a source connected to the power supply potential VCCQ, and the drain connected to the source of the transistor Tr1. The transistor Tr3 has the gate connected to the drain of the transistor Tr3 through the transistor Tr1 and connected to the bias line INB through the node N1, and forms a current mirror circuit with the transistor Tr5.

The transistor Tr4 has the gate connected to the gate of the transistor Tr1 and the drain of the transistor Tr2, a source connected to the power supply potential VCCQ, and the drain connected to the source of the transistor Tr2. The transistor Tr4 has the gate connected to the drain of the transistor Tr4 through the transistor Tr2 and connected to the bias line REFB through the node N2, and forms a current mirror circuit with the transistor Tr13.

The assist circuit AS1 includes a transistor Tr6 and a transistor Tr7. The transistor Tr6 and the transistor Tr7 are connected in series between the node N1 and the power supply potential VCCQ and in parallel with the transistors Tr1 and Tr3. The transistor Tr6 is diode-connected and forms a current mirror circuit with the transistor Tr5. The transistor Tr6 has a gate connected to the bias line INB, a drain connected to the node N1 and the gate of the transistor Tr6, and a source connected to a drain of the transistor Tr7. The transistor Tr7 receives the input signal VIN at a gate, and has the drain connected to the source of the transistor Tr6 and a source connected to the power supply potential VCCQ.

That is, the transistor Tr3 is not only diode-connected in itself but also diode-connected through the transistor Tr6. As a result, a mirror ratio of a drain current of the transistor Tr5 relative to a drain current (a current flowing from the load circuit 12 side to the node N1) of the transistor Tr3 can be changed in accordance with a level of the input signal VIN received at the gate of the transistor Tr7.

The assist circuit AS2 includes a transistor Tr8 and a transistor Tr9. The transistor Tr8 and the transistor Tr9 are connected in series between the node N2 and the power supply potential VCCQ and in parallel with the transistors Tr2 and Tr4. The transistor Tr8 is diode-connected and forms a current mirror circuit with the transistor Tr13. The transistor Tr8 has a gate connected to the bias line REFB, a drain connected to the node N2 and the gate of the transistor Tr8, and a source connected to a drain of the transistor Tr9. The transistor Tr9 receives the reference signal VREF at a gate, and has the drain connected to the source of the transistor Tr8 and the source connected to the power supply potential VCCQ.

That is, the transistor Tr4 is not only diode-connected in itself but also diode-connected through the transistor Tr8. As a result, a mirror ratio of a drain current of the transistor Tr13 relative to a drain current (a current flowing from the load circuit 12 side to the node N2) of the transistor Tr4 can be changed in response to a level of the reference signal VREF received at the gate of the transistor Tr9.

Here, it is possible to assume a configuration in which a diode-connected transistor (diode load) is connected between the node N1 and the power supply potential VCCQ in parallel with a direct connection of the transistors Tr1 and Tr3 and a direct connection of the transistors Tr6 and Tr7 in the configuration illustrated in FIG. 1. In this configuration, a potential of the internal node N1, that is, a signal level VINB of the bias line INB can change with respect to the input signal VIN illustrated in FIG. 2 as indicated by the dashed line in FIG. 2 That is, since the power to charge the node N1 becomes strong due to the effect of the diode-connected transistor (diode load), the signal amplitude (the difference between the H level and the L level) of the node N1 tends to become too small. As a result, a signal amplitude ΔVINB1 of the bias line INB (a signal amplitude of the internal node N1) is likely to become relatively smaller than an input signal amplitude ΔVIN, and accordingly, an output signal amplitude ΔOUT1 is likely to become relatively small. As a result, the gain of the differential amplifier circuit 10 is likely to decrease.

Figure 2:
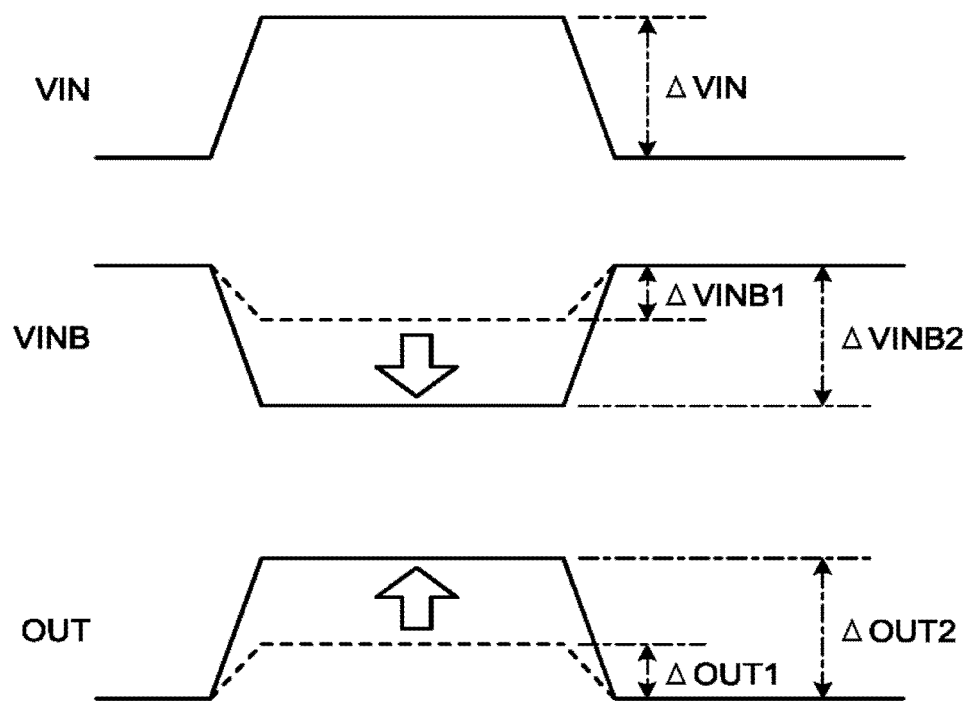
FIG. 2 is a waveform diagram illustrating an operation of the semiconductor device according to the first embodiment.

On the other hand, the diode-connected transistor (diode load) is not connected between the node N1 and the power supply potential VCCQ in parallel with the direct connection of the transistors Tr1 and Tr3 and the direct connection of the transistors Tr6 and Tr7 in the configuration illustrated in FIG. 1 in the first embodiment. As a result, it is possible to maintain the effect of the speed-up obtained by the cross-coupled circuit (load circuit 12) and the assist circuits AS1 and AS2 while avoiding excessive changing of the node N1. As a result, a signal amplitude ΔVINB2 of the bias line INB (a signal amplitude of the internal node N1) can be made larger than the signal amplitude VINB1, and accordingly, an output signal amplitude ΔOUT2 can be made larger than the output signal amplitude ΔOUT1 as illustrated in FIG. 2. As a result, the gain of the differential amplifier circuit 10 can be increased. Incidentally, FIG. 2 is a waveform diagram illustrating the operation of the semiconductor device 1.

As described above, the differential amplifier circuit 10 in the semiconductor device 1 is configured by combining the cross-coupled circuit and the assist circuit and removing the diode-connected transistor (diode load) in the first embodiment. As a result, the signal amplitude of the internal node N1 can be optimized, and the gain of the differential amplifier circuit 10 can be increased, and thus, the operation of the differential amplifier circuit 10 can be speeded up.

Figure 3:
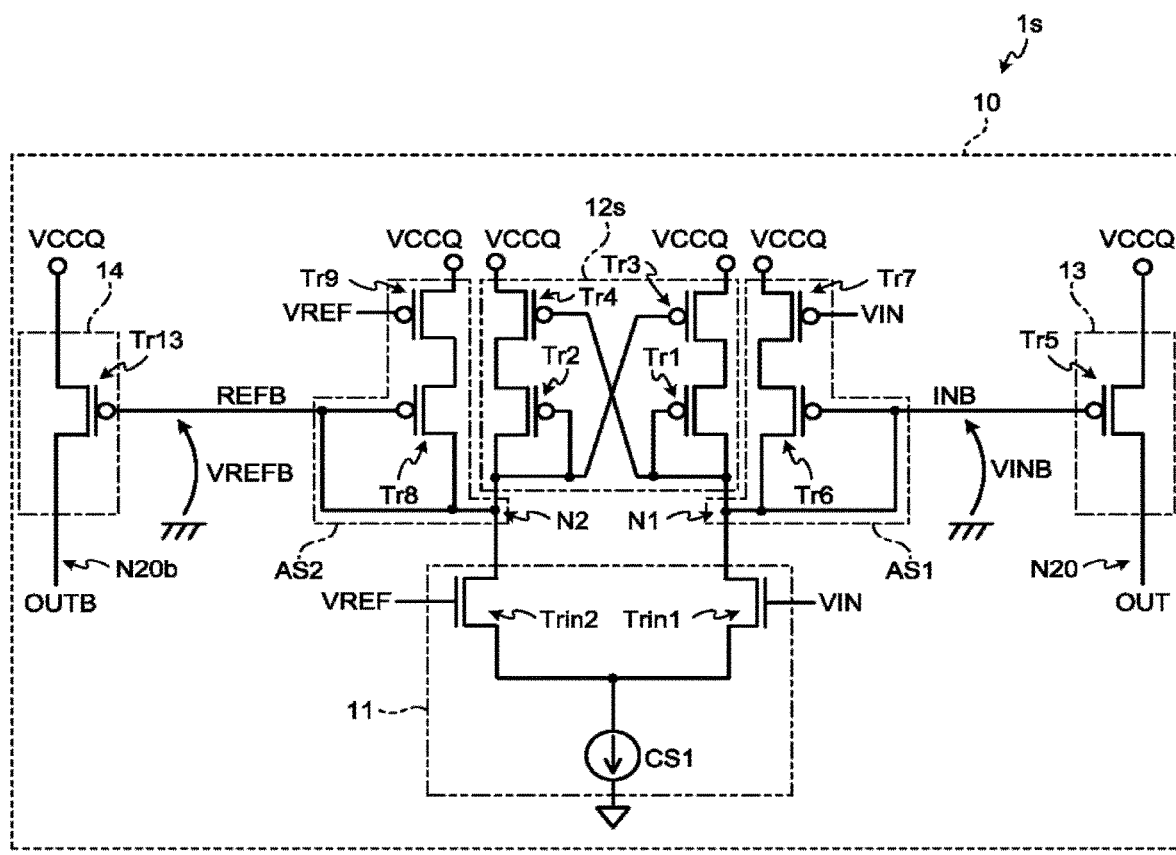
FIG. 3 is a circuit diagram illustrating a configuration of a semiconductor device according to a modification of the first embodiment.

Incidentally, a semiconductor device is may include a load circuit 12s illustrated in FIG. 3 instead of the load circuit 12 (see FIG. 1). FIG. 3 is a circuit diagram illustrating a configuration of the semiconductor device is according to a modification of the first embodiment. The load circuit 12s includes a transistor Tr1, a transistor Tr2, a transistor Tr3, and a transistor Tr4. The transistor Tr4 and the transistor Tr3 have gates and drains cross-coupled to each other. The transistor Tr3 is connected in series to the transistor Tr1, and the gate of the transistor Tr4 is connected to the drain of the transistor Tr3 through the transistor Tr1. The transistor Tr4 is connected in series to the transistor Tr2, and the gate of the transistor Tr3 is connected to the drain of the transistor Tr4 through the transistor Tr2. The transistor Tr1 (third transistor) is diode-connected without passing through the transistor Tr3 (first transistor). The transistor Tr2 (fourth transistor) is diode-connected without passing through the transistor Tr4 (second transistor). Each of the transistor Tr1, the transistor Tr2, the transistor Tr3, and the transistor Tr4 can be formed using a PMOS transistor. The same effect as that of the first embodiment can be realized even with such a configuration.

Second Embodiment

Next, a semiconductor device according to a second embodiment will be described. Hereinafter, portions different from those of the first embodiment will be mainly described.

Although the gain of the differential amplifier circuit 10 can be improved by securing the large signal amplitude of the internal node N1 in the semiconductor device 1 according to the first embodiment, a time width of a data part of a signal waveform is narrowed as a result, so that a timing margin is limited in some cases. Thus, it is desirable to further optimize the signal amplitude of the internal node such that the timing margin can be expanded in order to realize a higher-speed operation of the differential amplifier circuit.

Therefore, in the second embodiment, a potential adjustment circuit that adjusts a potential of an intermediate node in an assist circuit is added to achieve further optimization of adjustment of a signal amplitude of an internal node by the assist circuit and further speed-up of the differential amplifier circuit accompanying the optimization in a differential amplifier circuit of the semiconductor device.

Figure 4:
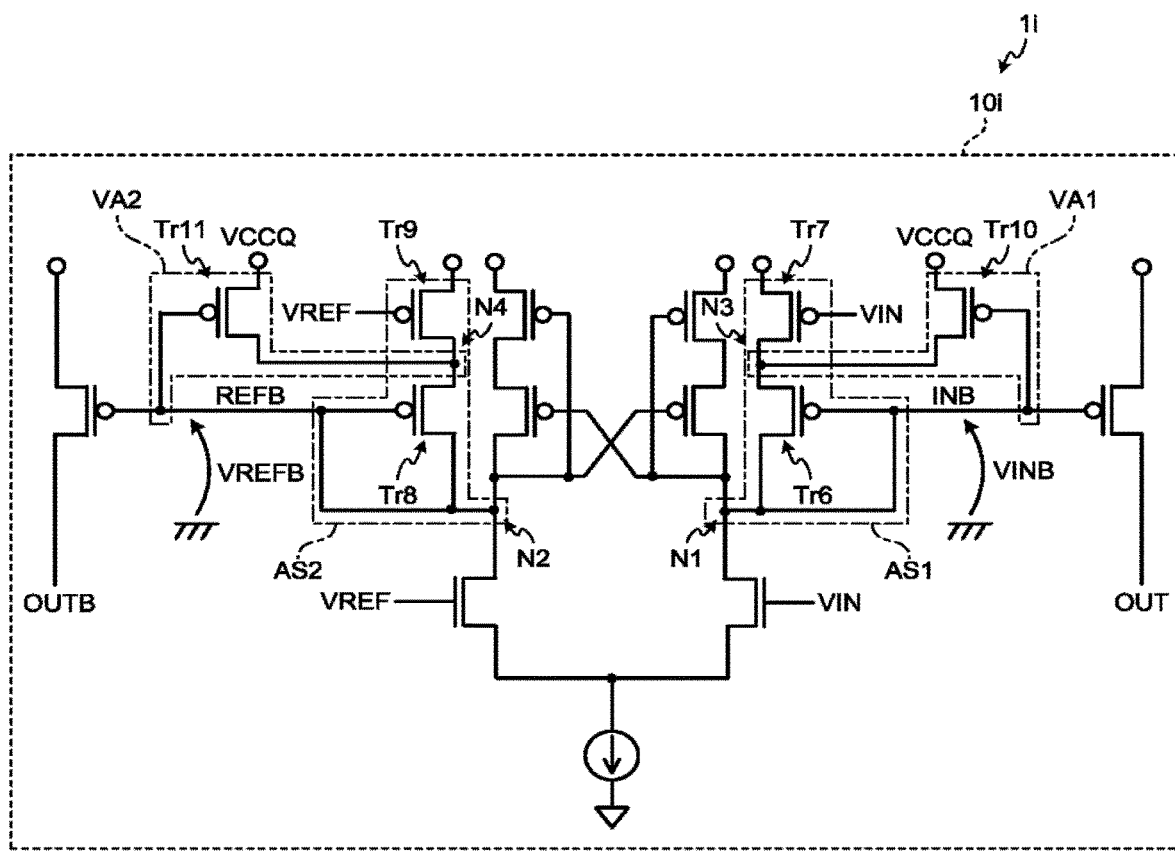
FIG. 4 is a circuit diagram illustrating a configuration of a semiconductor device according to a second embodiment.

Specifically, a semiconductor device 1i can be configured as illustrated in FIG. 4. FIG. 4 is a circuit diagram illustrating a configuration of the semiconductor device 1i according to the second embodiment.

The semiconductor device 1i has a differential amplifier circuit 10i instead of the differential amplifier circuit 10 (see FIG. 1). The differential amplifier circuit 10i further includes a potential adjustment circuit VA1 and a potential adjustment circuit VA2.

The potential adjustment circuit VA1 is connected to a node N3 and is configured to be capable of adjusting a potential of the node N3. The potential adjustment circuit VA1 has a control node connected to the bias line INB, an input node connected to the power supply potential VCCQ, and an output node connected to the node N3. As a result, the potential adjustment circuit VA1 can adjust the potential of the node N3 in accordance with a signal level of the bias line INB. The node N3 is an intermediate node in the assist circuit AS1, and is connected to a drain of the transistor Tr7 and a source of the transistor Tr6.

The potential adjustment circuit VA1 includes a transistor Tr10. The transistor Tr10 is connected to the source of the transistor Tr6 in parallel with the transistor Tr7. The transistor Tr10 is diode-connected through the transistor Tr6. The transistor Tr10 has a gate connected to the bias line INB, a source connected to the power supply potential VCCQ, and a drain connected to the node N3.

That is, the transistor Tr10 is diode-connected through the bias line INB and the transistor Tr6. As a result, the signal amplitude of the bias line INB is indirectly suppressed through adjustment of the potential of the intermediate node N3 of the assist circuit AS1. Thus, the signal amplitude of the bias line INB can be gently suppressed as compared with a case where the diode-connected transistor (diode load) is directly connected to the bias line INB (the case indicated by a dashed line in FIG. 2).

The potential adjustment circuit VA2 is connected to a node N4, and is configured to be capable of adjusting a potential of the node N4. The potential adjustment circuit VA2 has a control node connected to the bias line REFB, an input node connected to the power supply potential VCCQ, and an output node connected to the node N4. As a result, the potential adjustment circuit VA2 can adjust the potential of the node N4 in accordance with a signal level of the bias line REFB. The node N4 is an intermediate node in the assist circuit AS2, and is connected to a drain of the transistor Tr9 and a source of the transistor Tr8.

The potential adjustment circuit VA2 includes a transistor Tr11. The transistor Tr11 is connected to the source of the transistor Tr8 in parallel with the transistor Tr9. The transistor Tr11 is diode-connected through the transistor Tr8. The transistor Tr11 has a gate connected to the bias line REFB, a source connected to the power supply potential VCCQ, and a drain connected to the node N4.

That is, the transistor Tr11 is diode-connected through the bias line REFB and the transistor Tr8. As a result, the signal amplitude of the bias line REFB is indirectly suppressed through adjustment of the potential of the intermediate node N4 of the assist circuit AS2. Thus, the signal amplitude of the bias line REFB can be gently suppressed as compared with a case where the diode-connected transistor (diode load) is directly connected to the bias line REFB.

Figure 5:
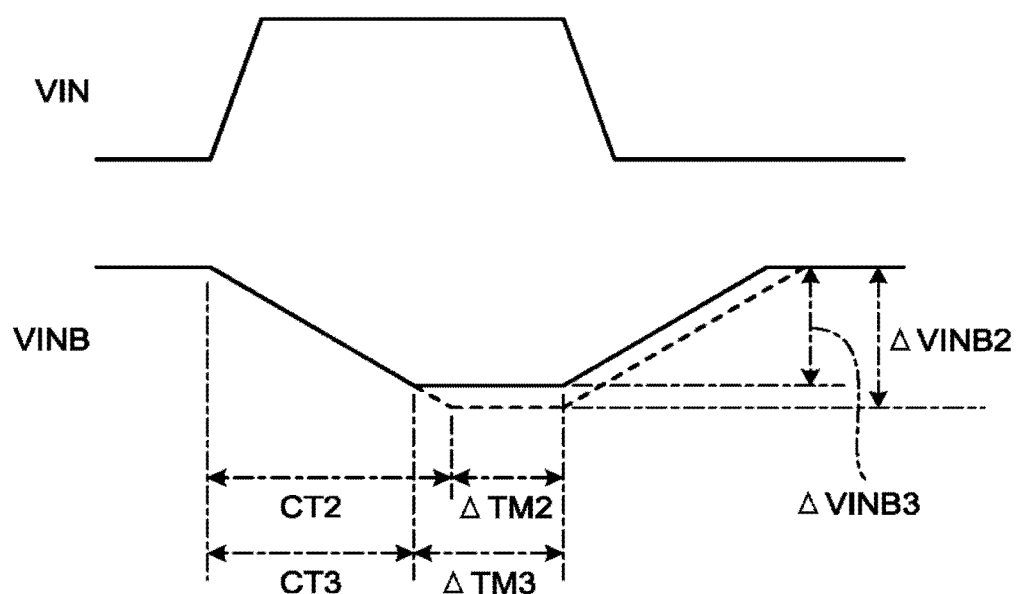
FIG. 5 is a waveform diagram illustrating an operation of the semiconductor device according to the second embodiment.

Here, consider a configuration in which the potential adjustment circuit VA1 is not connected to the node N3 in the configuration illustrated in FIG. 4. In this configuration, when the input signal VIN changes from L to H to L as illustrated in FIG. 5, the potential of the internal node N1, that is, the signal level VINB of the bias line INB can change as indicated by the dashed line in FIG. 5. A charging time CT2 of the node N3 tends to be long as the signal amplitude ΔVINB2 of the signal level VINB is secured to be large, and a timing margin ΔTM2 for determination on the L level when the signal level VINB changes from H to L to H tends to be relatively narrowed. As a result, the speed-up (high frequency) of the input signal VIN is likely to be limited.

On the other hand, the potential adjustment circuit VA1 is connected to the node N3 in the configuration illustrated in FIG. 4 in the second embodiment. As a result, a signal amplitude of the bias line INB can be gently suppressed through the potential adjustment of the node N3. As a result, as illustrated in FIG. 5, a signal amplitude ΔVINB3 of the signal level VINB can be gently suppressed as compared with the signal amplitude ΔVINB2, a charging time CT3 of the node N3 can be shortened as compared with the charging time CT2, and a timing margin ΔTM3 for determination on the L level when the signal level VINB changes from H to L to H can be secured to be wider than the timing margin ΔTM2. As a result, the speed-up (high frequency) of the input signal VIN can be easily obtained.

As described above, in the second embodiment, the potential adjustment circuit that adjusts the potential of the intermediate node N3 in the assist circuit AS1 is added in the differential amplifier circuit 10i of the semiconductor device 1i. As a result, the signal amplitude of the internal node N1 can be gently suppressed through the potential adjustment of the intermediate node N3, and the signal amplitude of the internal node N1 can be further optimized. As a result, the timing margin of the operation of the differential amplifier circuit 10i can be secured, and thus, the operation of the differential amplifier circuit 10i can be further speeded up.

Third Embodiment

Next, a semiconductor device according to a third embodiment will be described. Hereinafter, portions different from those of the first embodiment and the second embodiment will be mainly described.

In a differential amplifier circuit, a duty ratio of a signal sometimes deviates from an appropriate range due to variations in the course of manufacturing among a plurality of elements. As a result, duty cycle distortion (DCD) increases, a setup time and/or a hold time of a signal do not satisfy required specifications so that there is a possibility that it is difficult to properly use the signal in an internal circuit as an output destination.

Therefore, the semiconductor device is configured using two differential amplifier circuits of which polarities are inverted from each other to improve the duty ratio of the signal in the third embodiment.

Figure 6:
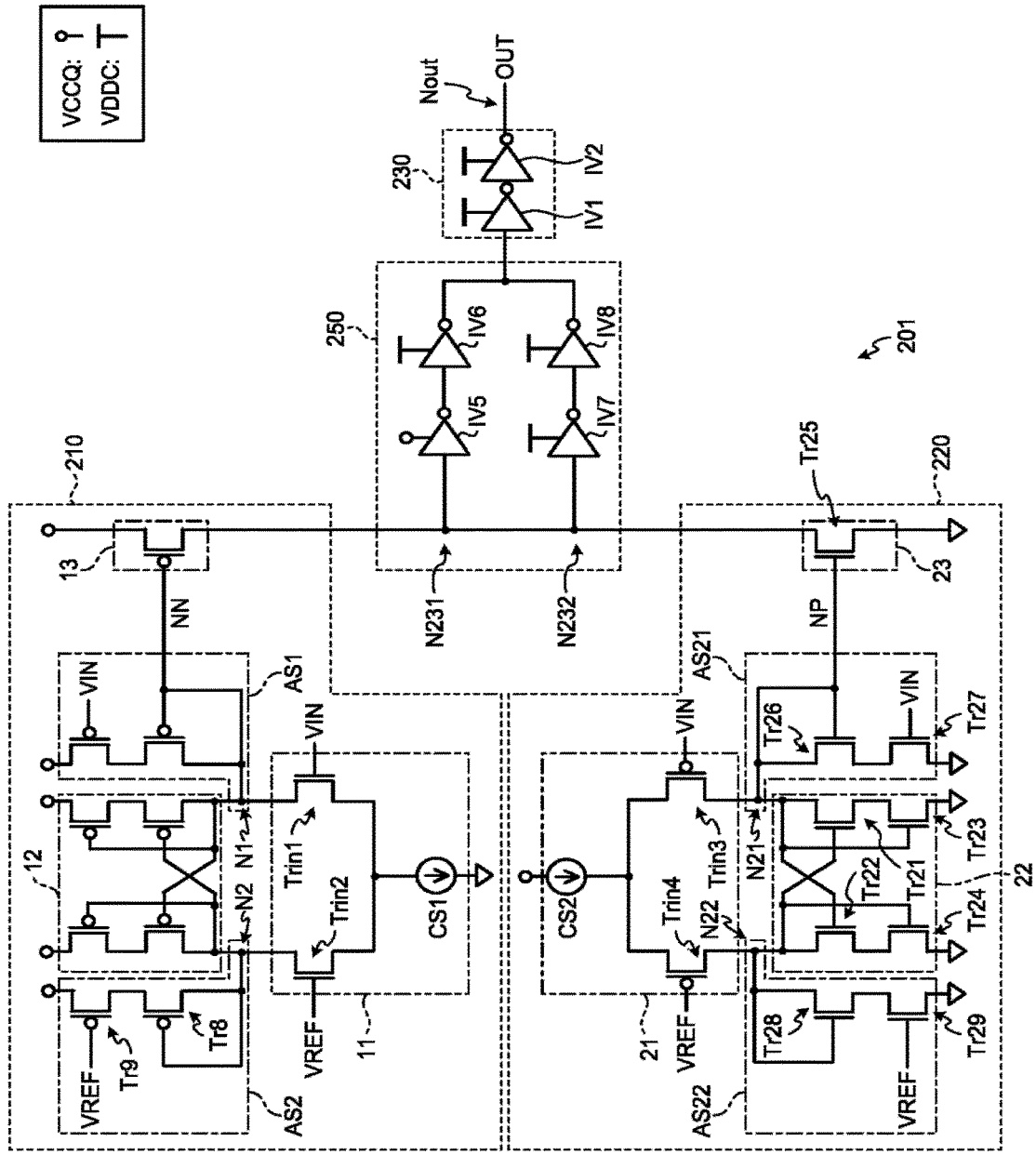
FIG. 6 is a circuit diagram illustrating a configuration of a semiconductor device according to a third embodiment.

Specifically, a semiconductor device 201 can be configured as illustrated in FIG. 6. FIG. 6 is a circuit diagram illustrating a configuration of the semiconductor device 201.

The semiconductor device 201 realizes a single input/single output circuit using the two differential amplifier circuits of which polarities are inverted from each other. The semiconductor device 201 receives the input signal VIN as a single input, converts the input signal VIN into two difference signals and amplifies the difference signals, generates the output signal OUT from a signal obtained by combining the two amplified difference signals, and outputs the output signal OUT as a single output.

The semiconductor device 201 includes a differential amplifier circuit 210, a differential amplifier circuit 220, a level shifter 250, and an output circuit 230. The differential amplifier circuit 210 and the differential amplifier circuit 220 are arranged in parallel with each other on an input side of the level shifter 250. The level shifter 250 is arranged between the differential amplifier circuit 210 and each of the differential amplifier circuit 220 and the output circuit 230.

The differential amplifier circuit 210 receives the input signal IN and the reference signal VREF, respectively, by the pair of transistors Trin1 and Trin2 that constitute a differential pair, and amplifies a difference between the input signal IN and the reference signal VREF using the power supply voltage VCCQ to generate a difference signal VO10.

The differential amplifier circuit 220 receives the input signal IN and the reference signal VREF, respectively, by a pair of transistors Trin3 and Trin4 that constitute a differential pair, and amplifies a difference between the input signal IN and the reference signal VREF using the power supply voltage VCCQ to generate a difference signal VO20.

The level shifter 250 receives the difference signal VO10 from the differential amplifier circuit 210, and receives the difference signal VO20 from the differential amplifier circuit 220. The level shifter 250 uses the power supply voltage VCCQ and a power supply voltage VDDC to shift a level of a signal obtained by combining the difference signal VO10 and the difference signal V020 and transfers the signal to the output circuit 230. A level of the power supply voltage VDDC is different from a level of the power supply voltage VCCQ, and can be set to be lower than the level of the power supply voltage VCCQ, for example. The power supply voltage VDDC is, for example, a power supply voltage which is used for an operation at the subsequent stage of the semiconductor device 201. The output circuit 230 uses the power supply voltage VDDC to generate and output the output signal OUT in response to the transferred signal.

The differential amplifier circuit 210 is configured by omitting the transfer circuit 14 from the differential amplifier circuit 10 (see FIG. 1).

The differential amplifier circuit 220 is configured to be symmetric (that is, have opposite polarities of included elements) with respect to the differential amplifier circuit 210.

That is, the differential amplifier circuit 220 includes a differential circuit 21, a load circuit 22, a transfer circuit 23, an assist circuit AS21, and an assist circuit AS22. The differential circuit 21 is arranged between the power supply potential VCCQ and the load circuit 22. The load circuit 22 is arranged between the differential circuit 21 and a ground potential. The load circuit 22 is configured using a circuit (cross-coupled circuit) in which gates and drains of two transistors are cross-coupled. The assist circuit AS21 is arranged between the load circuit 22 and the transfer circuit 23. The assist circuit AS22 is arranged on the opposite side of the assist circuit AS21 with respect to the load circuit 22.

The transfer circuit 23 includes a transistor Tr25. The transistor Tr25 can be configured using an NMOS transistor. A gate of the transistor Tr25 is connected to the assist circuit AS21 through a bias line NP. The transistor Tr25 has a drain connected to a node N232 and a source connected to the ground potential.

The differential circuit 21 includes a transistor Trin3, a transistor Trin4, and a current source CS2. The transistor Trin3 and the transistor Trin4 constitute a differential pair. Each of the transistor Trin3 and the transistor Trin4 can be configured using a PMOS transistor. The transistor Trin3 receives the input signal VIN at a gate, and has a drain electrically connected to a node N21 and a source electrically connected to one end of the current source CS2. The transistor Trin4 receives the reference signal VREF at a gate, and has a drain electrically connected to a node N22, and a source electrically connected to the one end of the current source CS2. The other end of the current source CS2 is electrically connected to the power supply potential VCCQ.

The load circuit 22 includes a transistor Tr21, a transistor Tr22, a transistor Tr23, and a transistor Tr24. The transistor Tr21 and the transistor Tr22 have gates and drains cross-coupled to each other. The transistor Tr23 is connected in series to the transistor Tr21 and is diode-connected through the transistor Tr21. The transistor Tr24 is connected in series to the transistor Tr22 and is diode-connected through the transistor Tr22. Each of the transistor Tr21, the transistor Tr22, the transistor Tr23, and the transistor Tr24 can be formed using an NMOS transistor.

The transistor Tr21 has the gate connected to a gate of the transistor Tr24 and the drain of the transistor Tr22, a source connected to a drain of the transistor Tr23, and the drain connected to the node N21.

The transistor Tr22 has the gate connected to a gate of the transistor Tr23 and the drain of the transistor Tr21, a source connected to a drain of the transistor Tr24, and the drain connected to the node N22.

The transistor Tr23 has the gate connected to the gate of the transistor Tr22 and the drain of the transistor Tr21, a source connected to the ground potential, and the drain connected to the source of the transistor Tr21. The transistor Tr23 has the gate connected to the drain of the transistor Tr23 through the transistor Tr21, is connected to the bias line NP through the node N21, and forms a current mirror circuit with the transistor Tr25.

The transistor Tr24 has the gate connected to the gate of the transistor Tr21 and the drain of the transistor Tr22, a source connected to the ground potential, and the drain connected to the source of the transistor Tr22. The transistor Tr24 has the gate connected to the drain of the transistor Tr24 through the transistor Tr22 and is connected to the node N22.

The assist circuit AS21 includes a transistor Tr26 and a transistor Tr27. The transistor Tr26 and the transistor Tr27 are connected in series between the node N21 and the ground potential and in parallel with the transistors Tr21 and Tr23. The transistor Tr26 is diode-connected and forms a current mirror circuit with the transistor Tr25. The transistor Tr26 has a gate connected to the bias line NP, a drain connected to the node N21 and the gate of the transistor Tr26, and a source connected to a drain of the transistor Tr27. The transistor Tr27 receives the input signal VIN at a gate, and has the drain connected to the source of the transistor Tr26 and a source connected to the ground potential.

That is, the transistor Tr23 is not only diode-connected in itself but also diode-connected through the transistor Tr26. As a result, a mirror ratio of a drain current of the transistor Tr25 relative to a drain current (a current flowing from the load circuit 22 side to the node N21) of the transistor Tr23 can be changed in accordance with a level of the input signal VIN received at the gate of the transistor Tr27.

The assist circuit AS22 includes a transistor Tr28 and a transistor Tr29. The transistor Tr28 and the transistor Tr29 are connected in series between the node N22 and the ground potential and in parallel with the transistors Tr22 and Tr24. The transistor Tr28 is diode-connected and forms a current mirror circuit with the transistor Tr23. The transistor Tr28 has a gate connected to the bias line REFB, a drain connected to the node N22 and the gate of the transistor Tr28, and a source connected to a drain of the transistor Tr29. The transistor Tr29 receives the reference signal VREF at a gate and has the drain connected to the source of the transistor Tr28, and a source connected to the ground potential.

The level shifter 250 has a plurality of inverters IV5, IV6, IV7, and IV8. The inverter IV5 has an input node connected to a node N231, and an output node connected to the inverter IV6. The inverter IV6 has an input node connected to the inverter IV5 and an output node connected to the output circuit 230. The inverter IV7 has an input node connected to the node N232 and an output node connected to the inverter IV8. The inverter IV8 has an input node connected to the inverter IV7 and an output node connected to the output circuit 230. The inverter IV5 operates using the power supply voltage VCCQ, and the inverters IV6 to IV8 operate using the power supply voltage VDDC. With this configuration, the levels of the difference signal VO10 and the difference signal VO20 are shifted, and the level-shifted signals are transferred to the output circuit 30.

The output circuit 230 also includes a plurality of inverters IV1 and IV2. The inverter IV1 has an input node connected to the level shifter 250 and an output node connected to the inverter IV2. The inverter IV2 has an input node connected to the inverter IV1 and an output node connected to an output node Nout of the semiconductor device 201. With this configuration, the output circuit 230 generates and outputs the output signal OUT in response to the difference signal VO10 and the difference signal VO20.

As described above, in the third embodiment, the semiconductor device 201 is configured using the two differential amplifier circuits 210 and 220 of which polarities are inverted from each other. As a result, the influence of manufacturing variations and the like can be suppressed, the duty ratio of the output signal can be kept within an appropriate range (for example, a range around the duty ratio of 50%), and the duty ratio of the output signal can be improved.

Fourth Embodiment

Next, a semiconductor device according to a fourth embodiment will be described. Hereinafter, portions different from those of the first to third embodiments will be mainly described.

In the assist circuits AS2 and AS22 on the reference signal side illustrated in FIG. 6, the transistors Tr9 and Tr29 operate in an auxiliary manner with respect to the transistors Tr8 and Tr28 as loads in response to the reference signal VREF. The assist circuits AS2 and AS22 can operate even if the transistors Tr9 and Tr29 are omitted.

Figure 7:
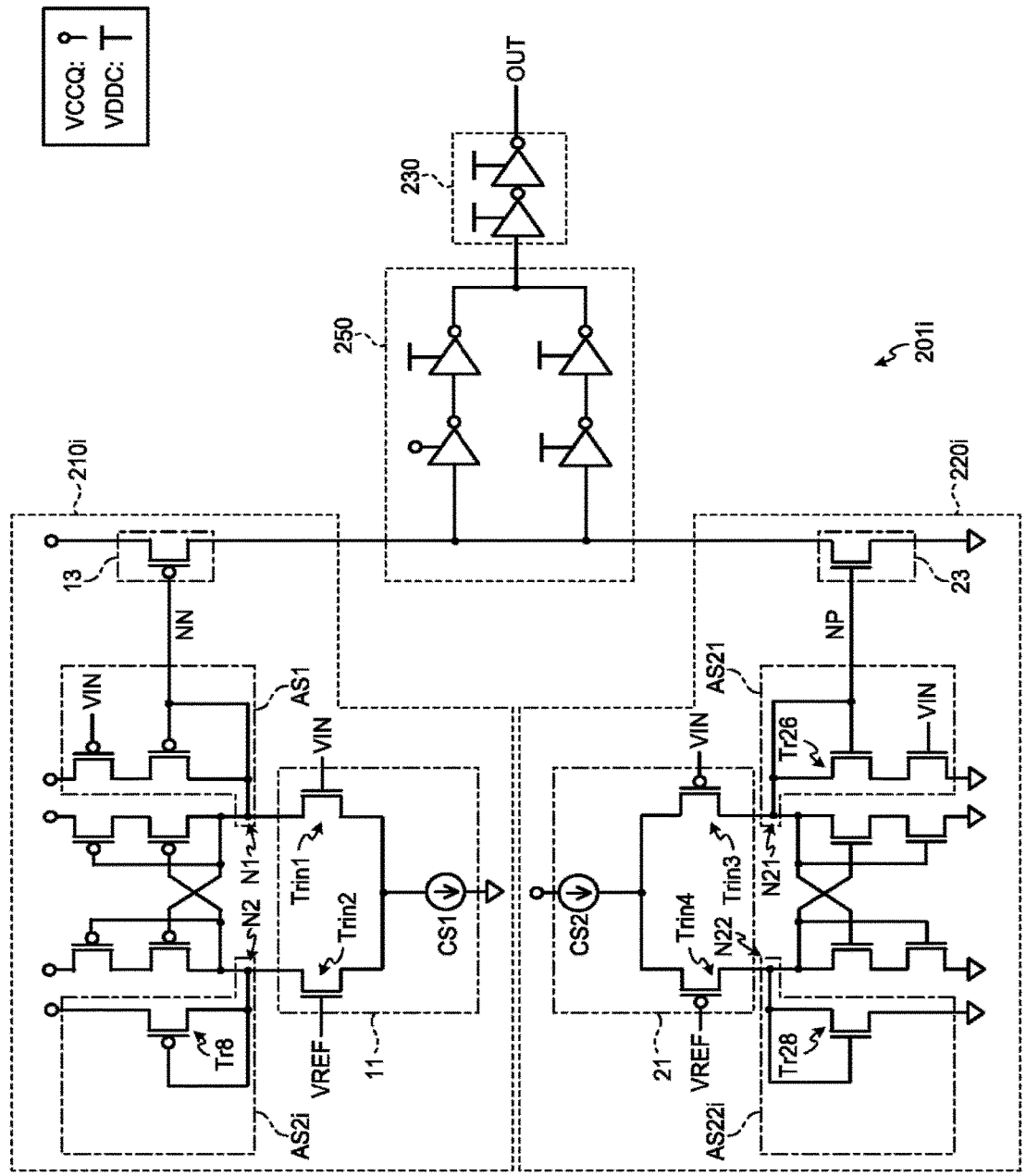
FIG. 7 is a circuit diagram illustrating a configuration of a semiconductor device according to a fourth embodiment.

Based on such a concept, a semiconductor device 201$i$ according to the fourth embodiment can be configured as illustrated in FIG. 7. FIG. 7 is a circuit diagram illustrating a configuration of the semiconductor device 201$i$ according to the fourth embodiment. The semiconductor device 201$i$ includes a differential amplifier circuit 210$i$ and a differential amplifier circuit 220$i$ instead of the differential amplifier circuit 210 and the differential amplifier circuit 220 (see FIG. 6).

The differential amplifier circuit 210$i$ includes an assist circuit AS2$i$ as an assist circuit on the reference signal side. The assist circuit AS2$i$ is configured by omitting the transistor Tr9 from the assist circuit AS2 (see FIG. 6). As a result, it is possible to reduce a total dimension (=W×L, W: gate width, L: gate length) of transistors constituting the assist circuit AS2$i$, and thus, it is possible to mitigate an effect of suppressing a potential amplitude of an internal node N2 by the assist circuit AS2$i$. In addition, the configuration of the assist circuit AS2$i$ can be simplified, and thus, it is possible to make a circuit area small (for example, the circuit area can be made 1/20 of that of the assist circuit AS2).

The differential amplifier circuit 220$i$ includes an assist circuit AS22$i$ as an assist circuit on the reference signal side. The assist circuit AS22$i$ is configured by omitting the transistor Tr29 from the assist circuit AS22 (see FIG. 6). As a result, it is possible to reduce a total dimension of transistors constituting the assist circuit AS22$i$, and thus, it is possible to mitigate the effect of suppressing the potential amplitude of the internal node N2 by the assist circuit AS22$i$. In addition, the configuration of the assist circuit AS22$i$ can be simplified, and thus, it is possible to make a circuit area small (for example, the circuit area can be made 1/20 of that of the assist circuit AS22).

As described above, in the fourth embodiment, the configurations of the assist circuits AS12$i$ and AS22$i$ on the reference signal side in the differential amplifier circuits 210$i$ and 220$i$ of the semiconductor device 201$i$ can be simplified, and the circuit area can be made small. With this configuration, it is possible to easily reduce cost of the semiconductor device 201$i$.

Fifth Embodiment

Next, a semiconductor device according to a fifth embodiment will be described. Hereinafter, portions different from those of the first to fourth embodiments will be mainly described.

In the differential circuits 11 and 21 illustrated in FIG. 7, the amount of each current that needs to be supplied from the current sources CS1 and CS2 sometimes changes in accordance with a polarity of the input signal VIN. For example, if the input signal VIN is at the L level, a differential amplifier circuit 210$j$, which is an NMOS input, mainly transmits a signal to the output node Nout side in preparation for a change of the input signal VIN from L to H, and thus, the current supplied from the current source CS2 can be made smaller than that of the current source CS1. If the input signal VIN is at the H level, a differential amplifier circuit 220$j$, which is a PMOS input, mainly transmits a signal to the output node Nout side in preparation for a change of the input signal VIN from H to L, and thus, the current supplied from the current source CS1 can be made smaller than that of the current source CS2. That is, it is possible to limit the amount of current that needs to be supplied from each of the current sources CS1 and CS2 in accordance with the polarity of the input signal VIN.

Figure 8:
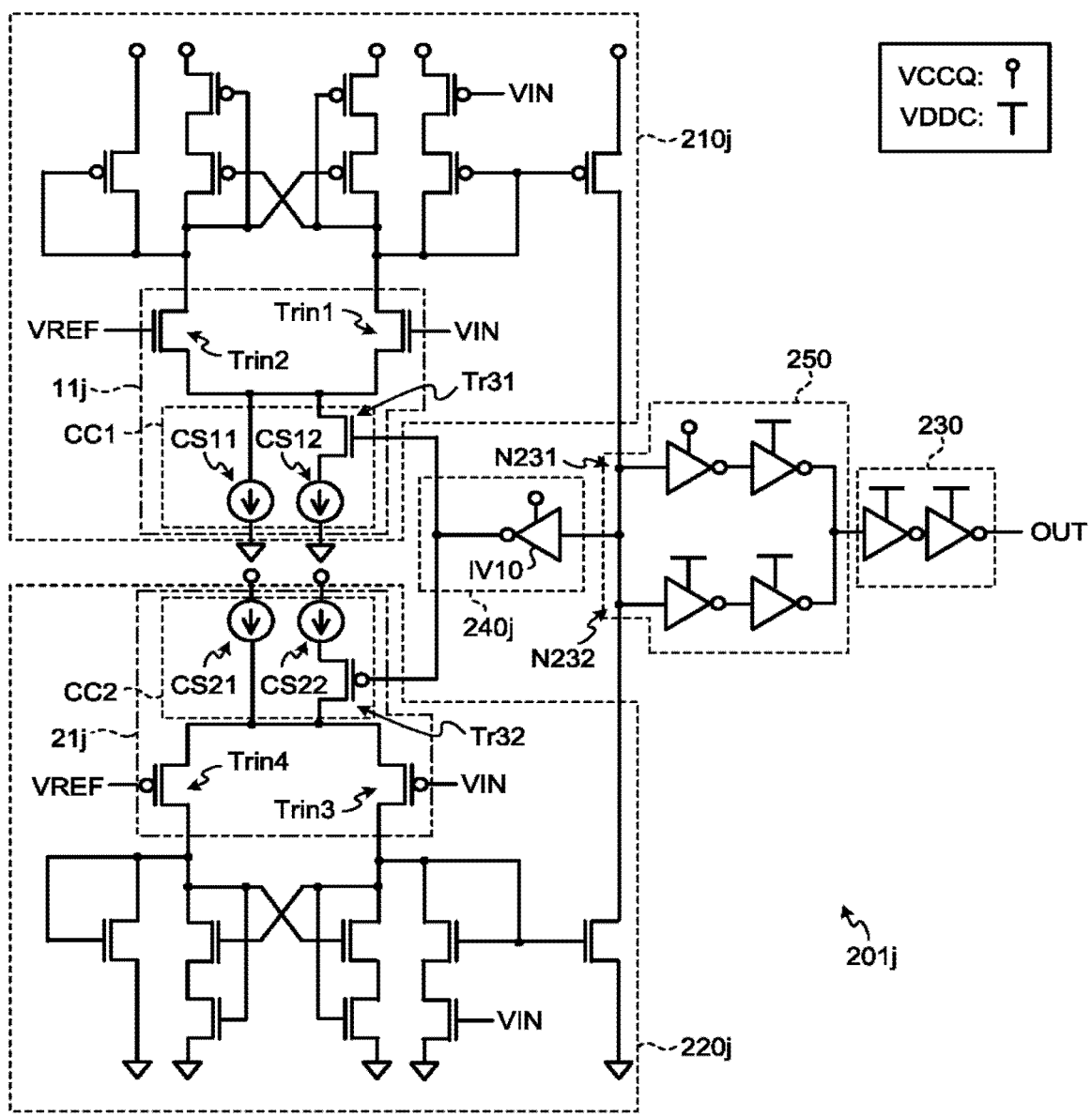
FIG. 8 is a circuit diagram illustrating a configuration of a semiconductor device according to a fifth embodiment.

Based on such a concept, a semiconductor device 201$j$ according to the fifth embodiment can be configured as illustrated in FIG. 8. FIG. 8 is a circuit diagram illustrating a configuration of the semiconductor device 201$j$ according to the fifth embodiment. The semiconductor device 201$j$ includes the differential amplifier circuit 210$j$ and the differential amplifier circuit 220$j$, instead of the differential amplifier circuit 210$i$ and the differential amplifier circuit 220$i$ (see FIG. 7), and further includes a control circuit 240$j$.

The differential amplifier circuit 210$j$ includes a differential circuit 11$j$. The differential circuit 11$j$ includes a variable current circuit CC1. The variable current circuit CC1 has an input node connected to a source of the transistor Trin1 and a source of the transistor Trin2, an output node connected to a ground potential, and a control node connected to the control circuit 240$j$. The variable current circuit CC1 switches, in accordance with a level of a control signal received from control circuit 240$j$, between a state where a first current amount flows from the input node to the output node and a state where a second current amount larger than the first current amount flows. The level of the control signal changes depending on the polarity of the input signal VIN.

The variable current circuit CC1 includes a current source CS11, a current source CS12, and a transistor Tr31. The current source CS11 and a series connection of the current source CS12 and the transistor Tr31 are connected in parallel with each other between the ground potential and the transistors Trin1 and Trin2. The current source CS11 and the current source CS12 can be equivalently configured by dividing the current source CS1 (see FIG. 7). The current source CS11 and the current source CS12 can be configured to satisfy the following Formula 1.

$$I11+I12 \approx I1 \quad \text{Formula 1}$$

In Formula 1, I11, I12, and I1 respectively represent the amount of current supplied from the current source CS11, the amount of current supplied from the current source CS12, and the amount of current supplied from the current source CS1 (see FIG. 7).

The current source CS11 has one end connected to the source of the transistor Trin1 and the source of the transistor Trin2, and the other end connected to the ground potential. The transistor Tr31 can be configured using an NMOS transistor. The transistor Tr31 has a gate connected to the control circuit 240*j*, a source connected to one end of the current source CS12, and a drain connected to the source of the transistor Trin1 and the source of the transistor Trin2. The other end of the current source CS12 is connected to the ground potential.

With this configuration, the variable current circuit CC1 can switch between the state where the current amount I11 flows from the input node to the output node and the state where the current amount I11+I12 (>I11) flows in accordance with the level of the control signal.

The differential amplifier circuit 220*j* includes a differential circuit 21*j*. The differential circuit 21*j* includes a variable current circuit CC2. The variable current circuit CC2 has an input node connected to a source of the transistor Trin3 and a source of the transistor Trin4, an output node connected to the ground potential, and a control node connected to the control circuit 240*j*. The variable current circuit CC2 switches, in accordance with a level of a control signal received from control circuit 240*j*, between a state where a third current amount flows from the input node to the output node and a state where a fourth current amount larger than the third current amount flows. The level of the control signal changes depending on the polarity of the input signal VIN.

The variable current circuit CC2 includes a current source CS21, a current source CS22, and a transistor Tr32. The current source CS21 and a series connection of the current source CS22 and the transistor Tr32 are connected in parallel with each other between the ground potential and the transistors Trin3 and Trin4. The current source CS21 and the current source CS22 can be equivalently configured by dividing the current source CS2 (see FIG. 7). The current source CS21 and the current source CS22 can be configured to satisfy the following Formula 2.

I21+I22≈I2　　　　　　　　Formula 2

In Formula 1, I21, I22, and I2 respectively represent the amount of current supplied from the current source CS21, the amount of current supplied from the current source CS22, and the amount of current supplied from the current source CS2 (see FIG. 7).

The current source CS21 has one end connected to the source of the transistor Trin3 and the source of the transistor Trin4, and the other end connected to the ground potential. The transistor Tr32 can be configured of an NMOS transistor. The transistor Tr32 has a gate connected to the control circuit 240*j*, a source connected to one end of the current source CS22, and a drain connected to the source of the transistor Trin3 and the source of the transistor Trin4. The other end of the current source CS22 is connected to the ground potential.

With this configuration, the variable current circuit CC2 can switch between the state where the current amount I21 flows from the input node to the output node and the state where the current amount I21+I22 (>I21) flows in accordance with the level of the control signal.

The control circuit 240*j* has an input node connected to the nodes N231 and N232 and an output node connected to the control node of the variable current circuit CC1, and the control node of the variable current circuit CC2. The control circuit 240*j* receives the difference signal VO10 from the differential amplifier circuit 210*j*, and receives the difference signal V020 from the differential amplifier circuit 220*j*. The control circuit 240*j* generates the control signal in response to a signal obtained by combining the difference signal VO10 and the difference signal VO20, and supplies the control signal to the variable current circuit CC1 and the variable current circuit CC2. The level of the signal changes depending on the level of the input signal VIN. The level of the control signal changes depending on the level of the signal. Thus, the level of the control signal changes depending on the level of the input signal VIN.

That is, the control circuit 240*j* controls each current amount of the variable current circuit CC1 and the variable current circuit CC2 in accordance with the level of input signal VIN. When the input signal VIN is at a first level, the control circuit 240*j* performs control to form the state where the variable current circuit CC1 supplies the first current amount and the state where the variable current circuit CC2 supplies the fourth current amount. When the input signal VIN is at a second level, the control circuit 240*j* controls the variable current circuit CC1 to the state of supplying the second current amount and the variable current circuit CC2 to the state of supplying the third current amount.

The control circuit 240*j* includes an inverter IN10. The inverter IN10 has an input node connected to the nodes N231 and N232 and an output node connected to the control node of the variable current circuit CC1, and a control node of the variable current circuit CC2. The inverter IN10 receives a signal, logically inverts a level of the signal to generate a control signal, and supplies the control signal to each of the variable current circuit CC1 and the variable current circuit CC2.

For example, when the input signal VIN changes to the L level, the signal changes to the L level, and accordingly, the control circuit 240*j* changes the control signal to the H level. That is, the control circuit 240*j* changes the control signal to the H level in preparation for the change from L to H of the input signal VIN. As a result, the transistor Tr31 is turned on, the variable current circuit CC1 supplies a current with the current amount I11+I12, and the transistor Tr32 is turned off, and the variable current circuit CC2 supplies a current with the current amount I21.

Alternatively, when the input signal VIN changes to the H level, the signal changes to the H level, and accordingly, the control circuit 240*j* changes the control signal to the L level. That is, the control circuit 240*j* changes the control signal to the L level in preparation for the change from H to L of the input signal VIN. As a result, the transistor Tr32 is turned on, and the variable current circuit CC2 supplies a current with the amount of current I21+I22, the transistor Tr31 is turned off, and the variable current circuit CC1 supplies a current with the amount of current I11.

As described above, in the fifth embodiment, the variable current circuits CC1 and CC2 are provided in the differential circuits 11*j* and 21*j* in the semiconductor device 201*j*, and the amount of each current that needs to be supplied is limited in accordance with the polarity of the input signal VIN. Thus, it is possible to reduce the current consumption of the semiconductor device 201*j*.

Sixth Embodiment

Next, a semiconductor device according to a sixth embodiment will be described. Hereinafter, portions different from those of the first to fifth embodiments will be mainly described.

Although gains of the differential amplifier circuits 210i and 220i can be improved by securing large signal amplitudes of the internal nodes N1 and N21 in the semiconductor device 201i illustrated in FIG. 7, a time width of a data part of a signal waveform is narrowed as a result, so that a timing margin is limited in some cases. In order to expand the timing margin, it is considered that it is effective to adjust potentials of the internal nodes N1 and N21 indirectly through potential adjustment of an intermediate node in an assist circuit.

Figure 9:
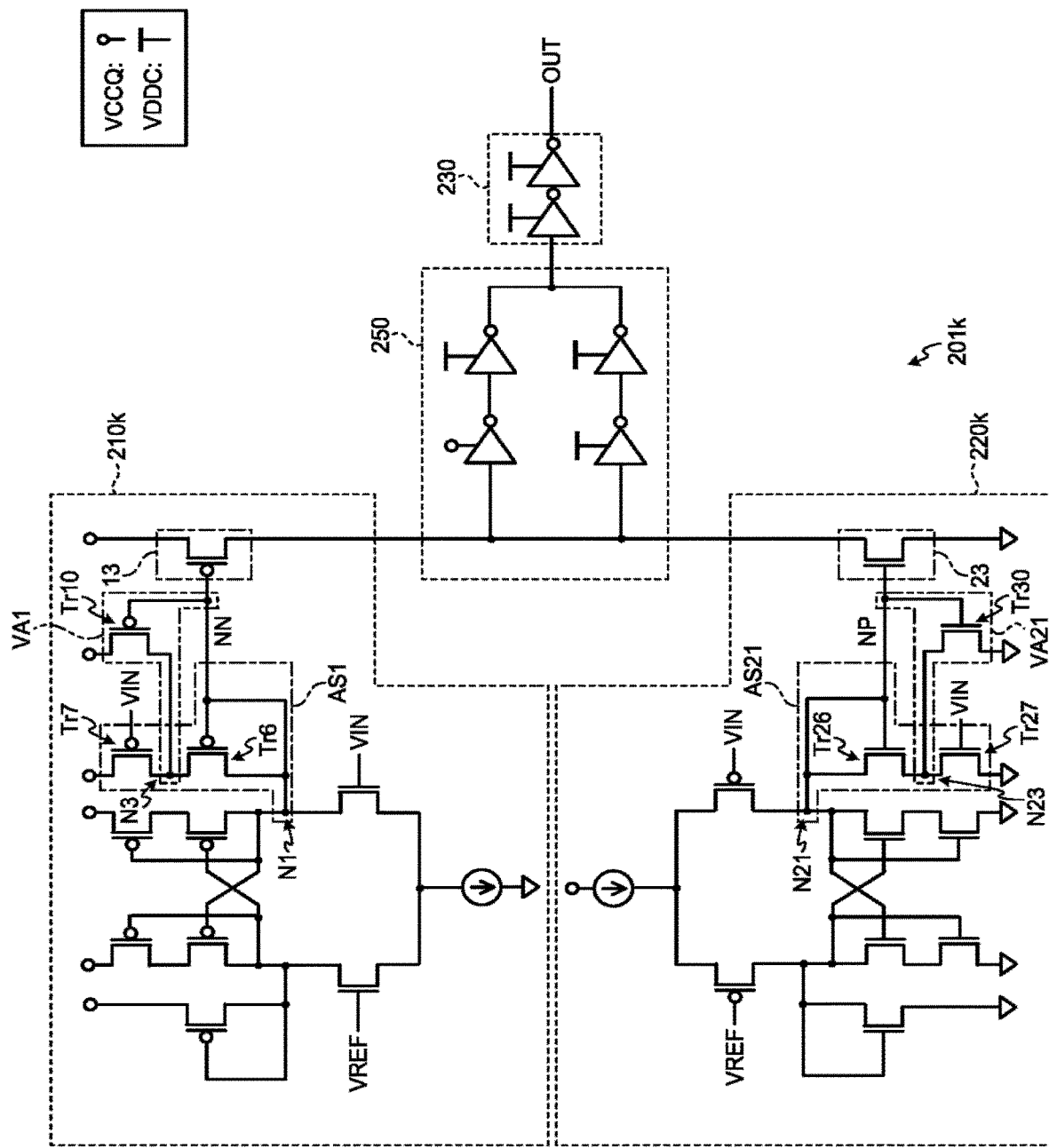
FIG. 9 is a circuit diagram illustrating a configuration of a semiconductor device according to a sixth embodiment.

Based on such a concept, a semiconductor device 201k according to the sixth embodiment can be configured as illustrated in FIG. 9. FIG. 9 is a circuit diagram illustrating a configuration of the semiconductor device 201k according to the sixth embodiment. The semiconductor device 201k includes a differential amplifier circuit 210k and a differential amplifier circuit 220k instead of the differential amplifier circuit 210i and the differential amplifier circuit 220i (see FIG. 7).

The differential amplifier circuit 210k further includes a potential adjustment circuit VA1. The potential adjustment circuit VA1 is connected to a node N3 and is configured to be capable of adjusting a potential of the node N3. The potential adjustment circuit VA1 has a control node connected to the bias line NN, an input node connected to the power supply potential VCCQ, and an output node connected to the node N3. As a result, the potential adjustment circuit VA1 can adjust the potential of the node N3 in accordance with a signal level of the bias line NN. The node N3 is an intermediate node in the assist circuit AS1, and is connected to a drain of the transistor Tr7 and a source of the transistor Tr6.

The potential adjustment circuit VA1 includes a transistor Tr10. The transistor Tr10 is connected to the source of the transistor Tr6 in parallel with the transistor Tr7. The transistor Tr10 is diode-connected through the transistor Tr6. The transistor Tr10 has a gate connected to the bias line NN, a source connected to the power supply potential VCCQ, and a drain connected to the node N3.

That is, the transistor Tr10 is diode-connected through the bias line NN and the transistor Tr6. As a result, the signal amplitude of the bias line NN is indirectly suppressed through adjustment of the potential of the intermediate node N3 of the assist circuit AS1. Thus, the signal amplitude of the bias line NN can be gently suppressed as compared with a case where a diode-connected transistor (diode load) is directly connected to the bias line NN.

The differential amplifier circuit 220k further includes a potential adjustment circuit VA21. The potential adjustment circuit VA21 is connected to a node N23 and is configured to be capable of adjusting a potential of the node N23. The potential adjustment circuit VA21 has a control node connected to the bias line NP, an input node connected to a ground potential, and an output node connected to the node N23. As a result, the potential adjustment circuit VA21 can adjust the potential of the node N23 in accordance with a signal level of the bias line NP. The node N23 is an intermediate node in the assist circuit AS21, and is connected to a drain of the transistor Tr27 and a source of the transistor Tr26.

The potential adjustment circuit VA21 includes a transistor Tr30. The transistor Tr30 is connected to the source of the transistor Tr26 in parallel with the transistor Tr27. The transistor Tr30 is diode-connected through the transistor Tr26. The transistor Tr30 has a gate connected to the bias line NP, a source connected to the ground potential, and a drain connected to the node N23.

That is, the transistor Tr30 is diode-connected through the bias line NP and the transistor Tr26. As a result, the signal amplitude of the bias line NP is indirectly suppressed through adjustment of the potential of the intermediate node N23 of the assist circuit AS21. Thus, the signal amplitude of the bias line NP can be gently suppressed as compared with a case where a diode-connected transistor (diode load) is directly connected to the bias line NP.

As described above, in the sixth embodiment, the potential adjustment circuits VA1 and VA21 that adjust the potentials of the intermediate nodes N3 and N23 in the assist circuits AS1 and AS21 are added, respectively, in the differential amplifier circuits 210k and 220k of the semiconductor device. As a result, each potential adjustment of the internal nodes N1 and N21 can be performed indirectly through each potential adjustment of the intermediate nodes N3 and N23, and thus, the signal amplitudes of the internal nodes N1 and N21 can be further optimized. As a result, a timing margin of an operation of each of the differential amplifier circuits 210k and 220k can be secured, and thus, the operations of the differential amplifier circuits 210k and 220k can be speeded up.

Seventh Embodiment

Next, a semiconductor device according to a seventh embodiment will be described. Hereinafter, portions different from those of the first to sixth embodiments will be mainly described.

In the semiconductor device 201k illustrated in FIG. 9, signals are transferred from the assist circuits AS1 and AS21 to the transfer circuits 13 and 23 through charging and discharging of charges with respect to the bias lines NN and NP, respectively. Thus, speed-up of the signal transfer from the assist circuits AS1 and AS21 to the transfer circuits 13 and 23 can be expected by speeding up charging and discharging of charges with respect to the bias lines NN and NP.

Figure 10:
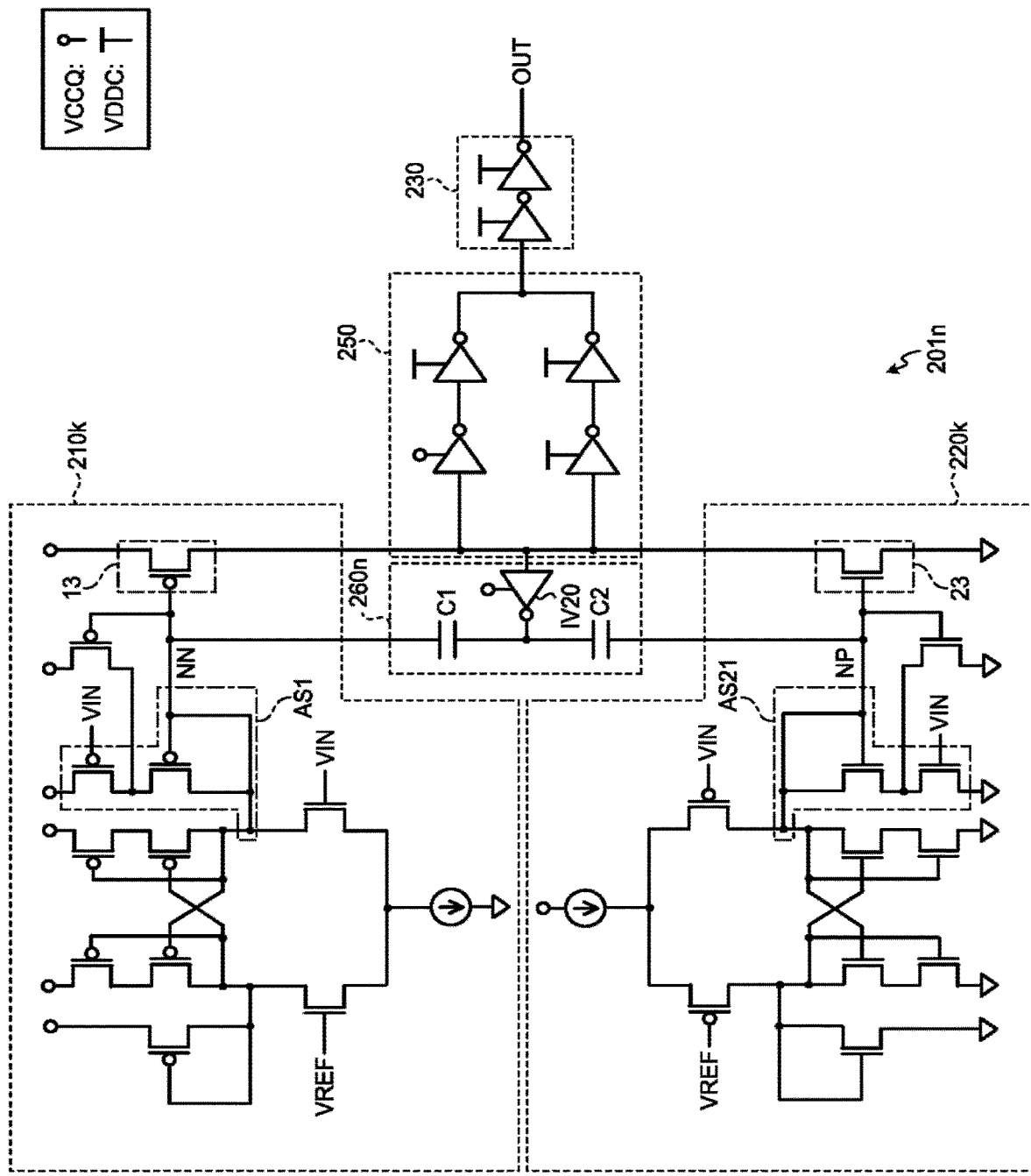
FIG. 10 is a circuit diagram illustrating a configuration of a semiconductor device according to a seventh embodiment.

Based on such a concept, a semiconductor device 201n according to the seventh embodiment can be configured as illustrated in FIG. 10. FIG. 10 is a circuit diagram illustrating a configuration of the semiconductor device 201n according to the seventh embodiment. The semiconductor device 201n further includes a kick cap circuit 260n. The kick cap circuit 260n performs feedback control on the differential amplifier circuit 210k and the differential amplifier circuit 220k.

The kick cap circuit 260n is arranged on a path returning from the transfer circuit 13 to the bias line NN, and arranged on a path returning from the transfer circuit 23 to the bias line NP. The kick cap circuit 260n includes an inverter IV20, a coupling capacitive element C1, and a coupling capacitive element C2.

A loop including the transfer circuit 13 to the inverter IV20 to the coupling capacitive element C1 to the bias line NN to the transfer circuit 13 forms a first feedback loop to perform the feedback control on the differential amplifier circuit 210k. The first feedback loop is a loop that is dc-cut off by the coupling capacitive element C1, that is, a DC-cut loop. Thus, the first feedback control can be selectively performed in a case where a level of the difference signal VO10 transferred from the transfer circuit 13 transitions. As a result, it is possible to cause a potential level of the bias line NN to rapidly transition from the H level to the L level or the L level to the H level while suppressing influence on a potential amplitude of the bias line NN.

A loop including the transfer circuit 23 to the inverter IV20 to the coupling capacitive element C2 to the bias line NP to the transfer circuit 23 forms a second feedback loop to perform the feedback control on the differential amplifier circuit 220k. The second feedback loop is a loop that is DC-cut off by the coupling capacitive element C2, that is, a DC-cut loop. Thus, the second feedback control can be selectively performed in a case where a level of the difference signal V020 transferred from the transfer circuit 23 transitions. As a result, it is possible to cause a potential level of the bias line NP to rapidly transition from the H level to the L level or the L level to the H level while suppressing influence on a potential amplitude of the bias line NP.

As described above, in the seventh embodiment, the kick cap circuit 260n that performs the feedback control on the differential amplifier circuit 210k and the differential amplifier circuit 220k is added in the semiconductor device 201n. As a result, the transition of the potential level of the bias lines NN and NP can be speeded up, and operations of the differential amplifier circuits 210k and 220k can be further speeded up.

Eighth Embodiment

Next, a semiconductor device according to an eighth embodiment will be described. Hereinafter, portions different from those of the first to seventh embodiments will be mainly described.

There is a case where a receiver as a high-speed interface of a semiconductor memory receives a differential signal. In the case of receiving a differential signal by a semiconductor device, it is effective to fully differentiate differential amplifier circuits in the semiconductor device.

Figure 11:
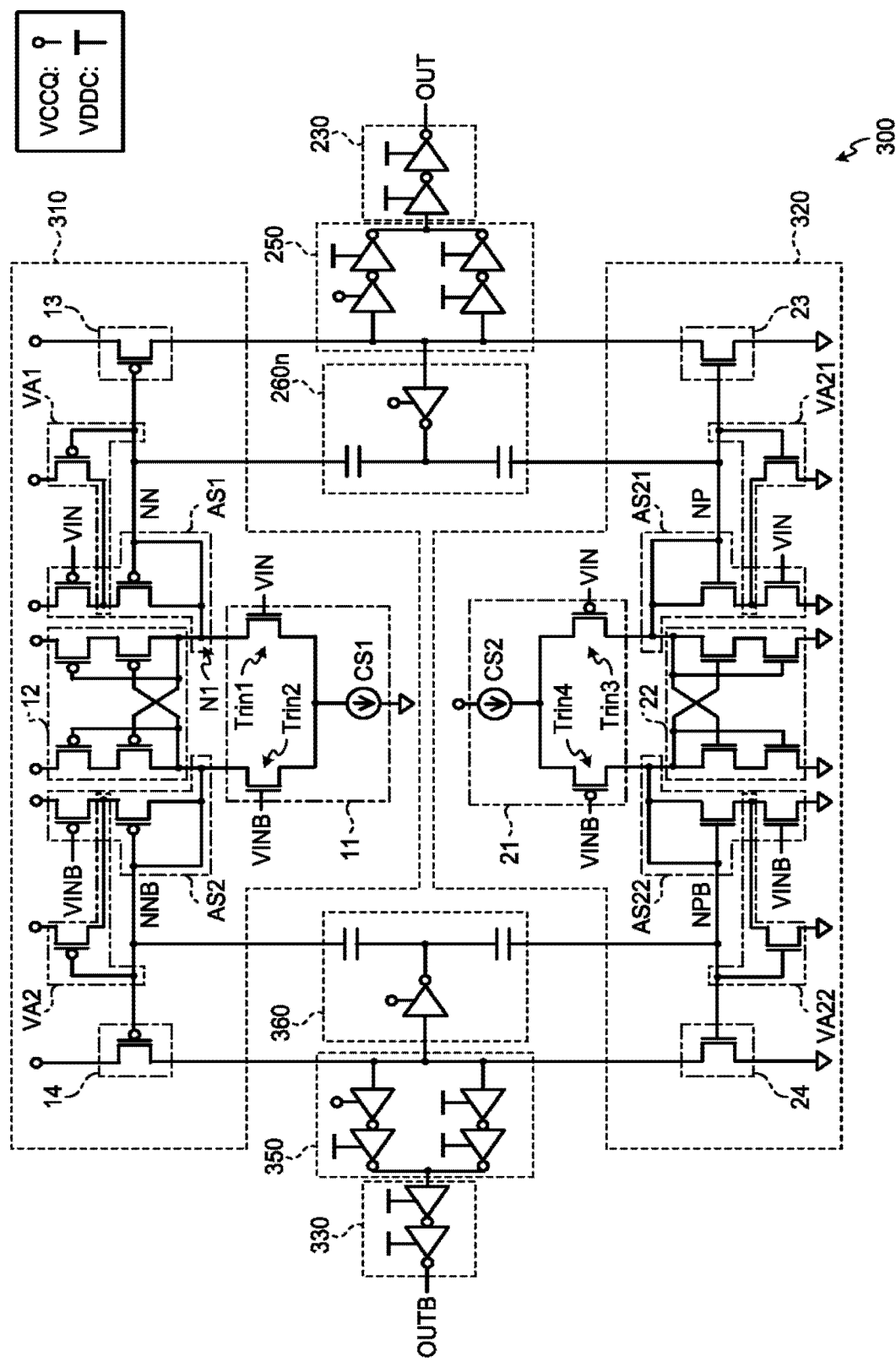
FIG. 11 is a circuit diagram illustrating a configuration of a semiconductor device according to an eighth embodiment.

Based on such a concept, a semiconductor device 300 according to the eighth embodiment can be configured as illustrated in FIG. 11. FIG. 11 is a circuit diagram illustrating a configuration of the semiconductor device 300 according to the eighth embodiment.

The semiconductor device 300 realizes a differential input/differential output circuit using two differential amplifier circuits of which polarities are inverted from each other. The semiconductor device 300 receives the input signal VIN and the input signal VINB as differential inputs, amplifies each of the input signal VIN and the input signal VINB, generates the output signal OUT and the output signal OUTB from the respective amplified signals, and outputs the output signals as differential outputs.

The semiconductor device 300 can be configured by making the following changes with respect to the configuration illustrated in FIG. 10. The differential amplifier circuits 210k and 220k are configured to correspond to the differential amplifier circuit 10i illustrated in FIG. 4, and the corresponding circuits will be referred to as differential amplifier circuits 310 and 320. A kick cap circuit 360, a level shifter 350, and an output circuit 330, configured to respectively correspond to the kick cap circuit 260n, the level shifter 250, and the output circuit 230 arranged on the output signal (non-inverted output signal) OUT side, are added to the output signal (inverted output signal) OUTB side.

The differential amplifier circuit 310 includes the differential circuit 11, the load circuit 12, the transfer circuit 13, the transfer circuit 14, the assist circuit AS1, the assist circuit AS2, the potential adjustment circuit VA1, and the potential adjustment circuit VA2. The differential amplifier circuit 320 includes the differential circuit 21, the load circuit 22, the transfer circuit 23, the transfer circuit 24, the assist circuit AS21, the assist circuit AS22, the potential adjustment circuit VA21, and the potential adjustment circuit VA22. A configuration and a function of each internal circuit in each of the differential amplifier circuits 310 and 320 are similar to those of the first embodiment and the second embodiment except that the transistors Trin1 and Trin3 receive the input signal (non-inverted input signal) VIN at gates thereof in the differential circuits 11 and 21 and that the transistors Trin2 and Trin4 receive the input signal (inverted input signal) VINB at gates thereof.

The kick cap circuit 260n is arranged on a path returning from the transfer circuit 13 to the bias line NN on the non-inversion side, and arranged on a path returning from the transfer circuit 23 to the bias line NP on the non-inversion side. The kick cap circuit 360 is arranged on a path returning from the transfer circuit 14 to a bias line NNB on the inversion side, and arranged on a path returning from the transfer circuit 24 to a bias line NPB on the inversion side. As a result, it is possible to speed up the transition of each potential level of the bias lines NN and NP on the non-inversion side and the bias lines NNB and NPB on the inversion side, and it is possible to speed up operations of the differential amplifier circuits 310 and 320 on the non-inversion side and the inversion side.

As described above, in the eighth embodiment, the respective differential amplifier circuits 310 and 320 in the semiconductor device 300 are fully differentiated. Accordingly, a circuit corresponding to a circuit on the non-inversion side is added to the inversion side. As a result, the differential input/differential output circuit can be realized in the semiconductor device 300.

Ninth Embodiment

Next, a semiconductor device according to a ninth embodiment will be described. Hereinafter, portions different from those of the first to eighth embodiments will be mainly described.

In the semiconductor device 300 illustrated in FIG. 11, each of the differential outputs is sometimes affected by a noise component (for example, power supply noise and/or common mode noise). In order to suppress the influence of the noise component, it is effective to provide a circuit configured to suppress the noise component for each of the differential outputs.

Figure 12:
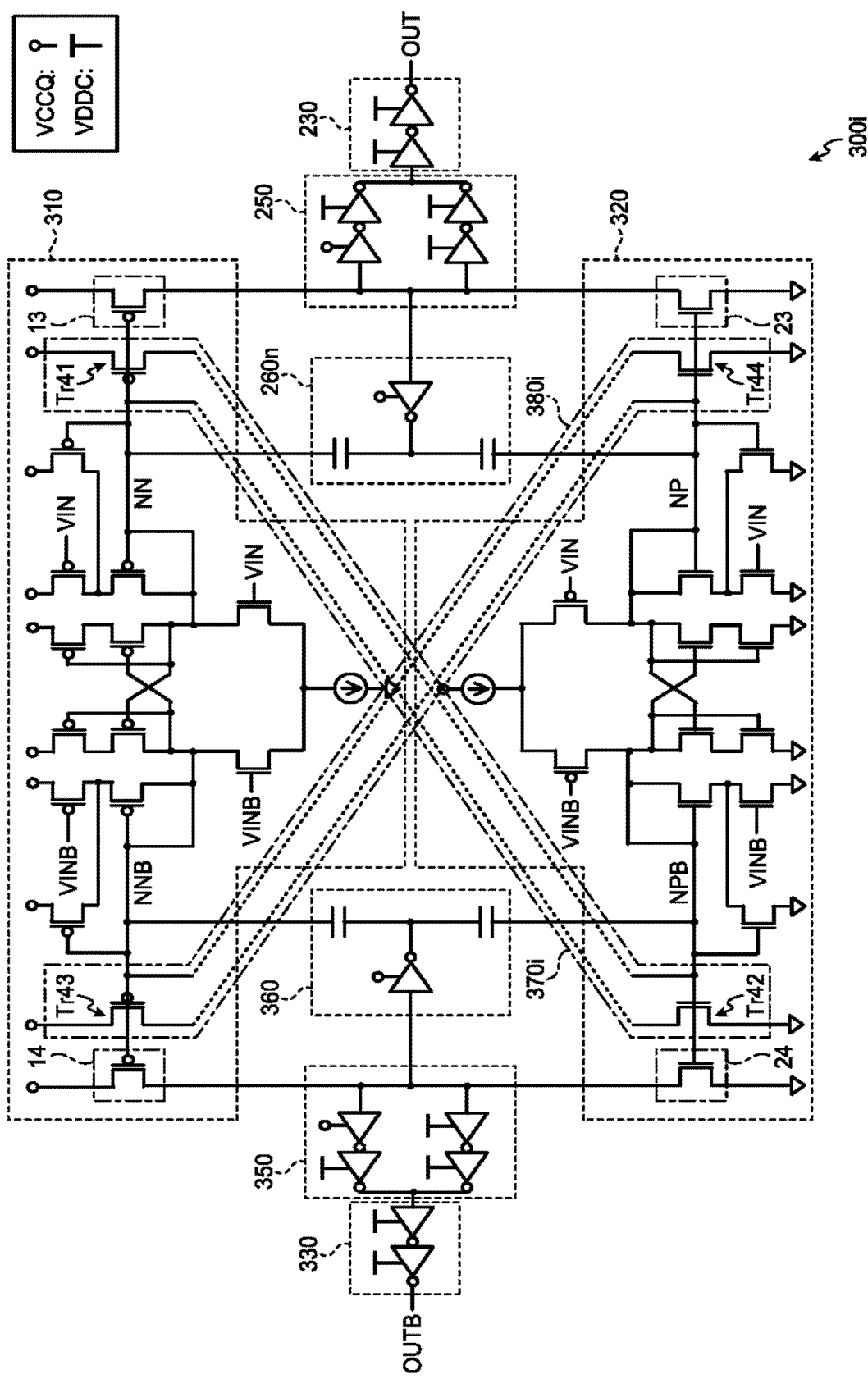
FIG. 12 is a circuit diagram illustrating a configuration of a semiconductor device according to a ninth embodiment.

Based on such a concept, a semiconductor device 300i according to the ninth embodiment includes correction circuits 370i and 380i as illustrated in FIG. 12.

The correction circuit 370i is connected to the bias line NN on the non-inversion side in the differential amplifier circuit 310 and the bias line NPB on the inversion side in the differential amplifier circuit 320. The correction circuit 370i includes a transistor Tr41 and a transistor Tr42. The transistor Tr41 can be configured using a PMOS transistor. The transistor Tr42 can be configured of an NMOS transistor. The transistor Tr41 has a gate connected to the bias line NN, a source connected to the power supply potential VCCQ, and a drain connected to the bias line NPB. The transistor Tr42 has a gate connected to the bias line NPB, a source connected to the ground potential, and a drain connected to the bias line NN. As a result, the correction circuit 370i can transmit a noise component between the bias line NN on the non-inversion side and the bias line NPB on the inversion side.

The correction circuit 380i is connected to the bias line NNB on the inversion side in the differential amplifier circuit 310 and the bias line NP on the non-inversion side in the differential amplifier circuit 320. The correction circuit 380i includes a transistor Tr43 and a transistor Tr44. The transistor Tr43 can be configured using a PMOS transistor. The transistor Tr44 can be configured of an NMOS transistor. The transistor Tr43 has a gate connected to the bias line NNB, a source connected to the power supply potential VCCQ, and a drain connected to the bias line NP. The transistor Tr44 has a gate connected to the bias line NP, a source connected to the ground potential, and a drain connected to the bias line NNB. As a result, the correction circuit 380*i* can transmit a noise component between the bias line NNB on the inversion side and the bias line NP on the non-inversion side.

With operations of the correction circuit 370*i* and the correction circuit 380*i*, a noise component included in the difference signal VO10 transferred from the transfer circuit 13 to the level shifter 250 and a noise component included in the difference signal V020 transferred from the transfer circuit 23 to the level shifter 250 can have amplitudes close to each other with opposite polarities. As a result, the level shifter 250 can combine the difference signal VO10 and the difference signal V020 to generate a signal with reduced noise components.

Similarly, with the operations of the correction circuit 370*i* and the correction circuit 380*i*, a noise component included in a difference signal VO10B transferred from the transfer circuit 14 to the level shifter 350 and a noise component included in a difference signal VO20B transferred from the transfer circuit 24 to the level shifter 350 can have amplitudes close to each other with inverted polarities. As a result, the level shifter 350 can combine the difference signal VO10B and the difference signal VO20B to generate a signal with reduced noise components.

As described above, in the ninth embodiment, in the semiconductor device 300*i*, the correction circuit 370*i* is provided between the bias line NN on the non-inversion side and the bias line NPB on the inversion side, and the correction circuit 380*i* is provided between the bias line NNB on the inversion side and the bias line NP on the non-inversion side. As a result, the influence of the noise components (for example, the power supply noise and/or common mode noise) in the semiconductor device 300*i* can be suppressed, and it is possible to improve a noise removal ratio (for example, a power supply rejection ratio (PSRR) and/or a common mode rejection ratio (CMRR)) of the semiconductor device 300*i*.

Tenth Embodiment

Next, a semiconductor device according to a tenth embodiment will be described. Hereinafter, portions different from those of the first to ninth embodiments will be mainly described.

Although noise components are reduced by combining two signals corrected such that the noise components are included with the opposite polarities in the semiconductor device 300*i* illustrated in FIG. 12, noise components can be also reduced by taking a difference between two signals corrected such that the noise components are included with the same polarity.

Figure 13:
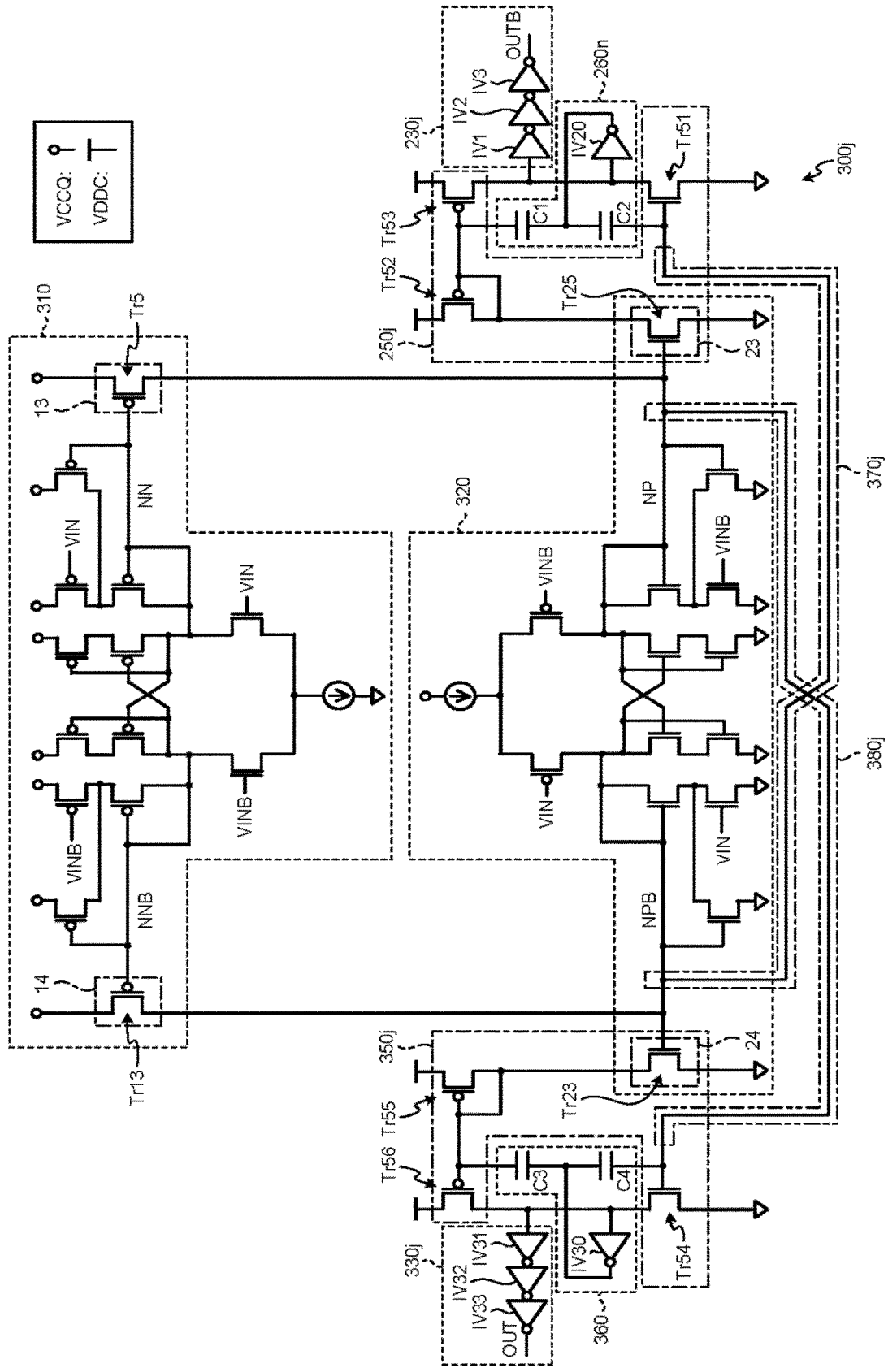
FIG. 13 is a circuit diagram illustrating a configuration of a semiconductor device according to a tenth embodiment.

Based on such a concept, a semiconductor device 300*j* according to the tenth embodiment includes correction circuits 370*j* and 380*j*, level shifters 250*j* and 350*j*, and output circuits 230*j* and 330*j* as illustrated in FIG. 13. FIG. 13 is a circuit diagram illustrating a configuration of the semiconductor device 300*j* according to the tenth embodiment.

The correction circuit 370*j* includes a line connected to an input node on a non-inversion side of the level shifter 250*j* and the bias line NPB on an inversion side of the differential amplifier circuit 320. As a result, the correction circuit 370*j* can transmit a noise component between the input node on the non-inversion side in the level shifter 250*j* and the bias line NPB on the inversion side.

The correction circuit 380*j* includes a line connected to an input node on the inversion side of the level shifter 350*j* and the bias line NP on the non-inversion side of the differential amplifier circuit 320. As a result, the correction circuit 380*j* can transmit a noise component between the input node on the inversion side in the level shifter 350*j* and the bias line NP on the non-inversion side.

The level shifter 250*j* shares the differential amplifier circuit 320 and the transfer circuit 23 (transistor Tr25), and is configured using a differential amplifier. The kick cap circuit 260*n* is connected between an output node of the differential amplifier, and a differential stage and a load stage.

The level shifter 250*j* includes the transistor Tr25, a transistor Tr51, a transistor Tr52, and a transistor Tr53. The transistor Tr25 and the transistor Tr51 constitute the differential stage, and the transistor Tr52 and the transistor Tr53 form a current mirror circuit to constitute the load stage. Each of the transistor Tr25 and the transistor Tr51 can be configured using an NMOS transistor. Each of the transistor Tr52 and the transistor Tr53 can be configured using a PMOS transistor. A gate of the transistor Tr25 functions as an input node on the inversion side in the differential stage, and a gate of the transistor Tr51 functions as an input node on the non-inversion side in the differential stage. The transistor Tr25 has a gate connected to the bias line NP, a drain connected to a drain of the transistor Tr52, and a source connected to a ground potential. The transistor Tr51 has the gate connected to the bias line NPB through the correction circuit 370*j*, a drain connected to one end of the coupling capacitive element C2, and a source connected to the ground potential. The transistor Tr52 has a gate connected to the drain of the transistor Tr52, a gate of the transistor Tr53, and the one end of the coupling capacitive element C1 and a source connected to the power supply potential VDDC. The transistor Tr53 has a gate connected to the drain of the transistor Tr52, the gate of the transistor Tr52, and the one end of the coupling capacitive element C1, a source connected to the power supply potential VDDC, and a drain connected to an output node of the level shifter 250*j*. An output node of the level shifter 250*j* is connected to an input node of the kick cap circuit 260*n* and an input node of the output circuit 230*j*. The output circuit 230*j* includes a series connection of an odd number of the inverters IV1 to IV3.

The level shifter 350*j* shares the transfer circuit 24 with the differential amplifier circuit 320, and is configured using a differential amplifier. The kick cap circuit 360 is connected between an output node of the differential amplifier, and a differential stage and a load stage.

With this configuration, a noise component included in a signal transferred from the bias line NP on the non-inversion side to the input node on the inversion side and a noise component included in a signal transferred from the bias line NPB on the inversion side to the input node on the non-inversion side can have amplitudes close to each other with the same polarity. As a result, the level shifter 250*j* can take a difference between a signal of the bias line NP and a signal of the bias line NPB and shift a level of a difference signal of which noise components have been reduced. That is, the level shifter 250*j* does not perform full swing on a signal in a VCCQ region, but shifts the level to a VDDC region and then performs the full swing so that it is possible to further improve a noise rejection ratio (for example, a PSRR and/or a CMRR).

In addition, the level shifter 250*j* can take a difference between the signal of the bias line NP and the signal of the bias line NPB and cause a duty ratio of the signal to fall within an appropriate range (for example, a range around 50%).

The level shifter 350*j* includes the transistor Tr23, a transistor Tr54, a transistor Tr55, and a transistor Tr56. The transistor Tr23 and the transistor Tr54 constitute the differential stage, and the transistor Tr55 and the transistor Tr56 form a current mirror circuit to constitute the load stage. Each of the transistor Tr23 and the transistor Tr54 can be configured using a PMOS transistor. Each of the transistor Tr55 and the transistor Tr56 can be configured using an NMOS transistor. A gate of the transistor Tr23 functions as an input node on the non-inversion side in the differential stage, and a gate of the transistor Tr54 functions as an input node on the inversion side in the differential stage. The transistor Tr23 has a gate connected to the bias line NPB, a drain connected to a drain of the transistor Tr55, and a source connected to the ground potential. The transistor Tr54 has a gate connected to the bias line NP through the correction circuit 380*j*, a drain connected to one end of a coupling capacitive element C4, and a source connected to the ground potential. The transistor Tr55 has a gate connected to the drain of the transistor Tr55, a gate of the transistor Tr56, and one end of a coupling capacitive element C3 and a source connected to the power supply potential VDDC. The transistor Tr56 has the gate connected to the drain of the transistor Tr55, the gate of the transistor Tr55, and the one end of the coupling capacitive element C3, a source connected to the power supply potential VDDC, and a drain connected to the output node of the level shifter 250*j*. An output node of the level shifter 250*j* is connected to an input node of the kick cap circuit 360 and the input node of the output circuit 230*j*. The kick cap circuit 360 includes an inverter IV30 and the coupling capacitive elements C3 and C4. The output circuit 330*j* includes a series connection of an odd number of inverters IV31 to IV33.

With this configuration, a noise component included in a signal transferred from the bias line NPB on the inversion side to the input node on the non-inversion side and a noise component included in a signal transferred from the bias line NPB on the non-inversion side to the input node on the inversion side can have amplitudes close to each other with the same polarity. As a result, the level shifter 350*j* can take a difference between a signal of the bias line NPB and a signal of the bias line NP and shift a level of a difference signal of which noise components have been reduced. That is, the level shifter 350*j* does not perform full swing on a signal in a VCCQ region, but shifts the level to a VDDC region and then performs the full swing so that it is possible to further improve a noise rejection ratio (for example, a PSRR and/or a CMRR).

In addition, the level shifter 350*j* can take a difference between the signal of the bias line NPB and the signal of the bias line NP and cause a duty ratio of the signal to fall within an appropriate range (for example, a range around 50%).

As described above, in the tenth embodiment, the level shifters 250*j* and 350*j* take the difference between two signals corrected such that noise components are included with the same polarity in the semiconductor device 300*j*. As a result, it is possible to further suppress the influence of the noise components in the semiconductor device 300*i*, and it is possible to further improve a noise removal ratio of the semiconductor device 300*i*.

Eleventh Embodiment

Next, a semiconductor device according to an eleventh embodiment will be described. Hereinafter, portions different from those of the first to tenth embodiments will be mainly described.

Although noise components are reduced by taking the difference between two signals corrected such that the noise components are included with the same polarity in the semiconductor device 300*j* illustrated in FIG. 13, it is also possible to take two sets of a difference between two signals corrected such that noise components are included with the same polarity for the differential amplifier circuits 310 and 320 having opposite polarities and combine the signals for each set.

Figure 14:
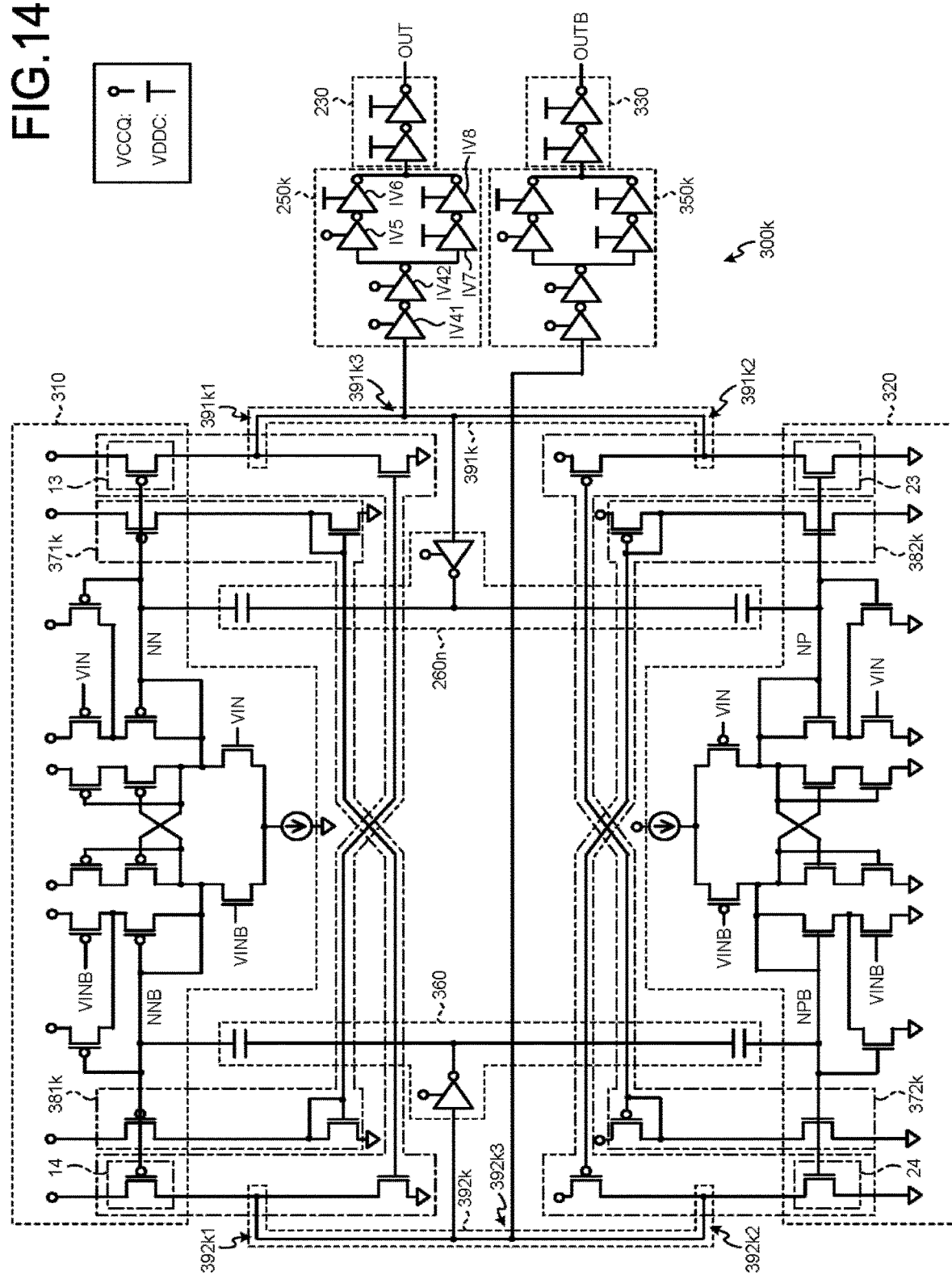
FIG. 14 is a circuit diagram illustrating a configuration of a semiconductor device according to an eleventh embodiment.

Based on such a concept, a semiconductor device 300*k* according to the eleventh embodiment includes correction circuits 371*k*, 372*k*, 381*k*, and 382*k*, connection circuits 391*k* and 392*k*, and level shifters 250*k* and 350*k* as illustrated in FIG. 14. FIG. 14 is a circuit diagram illustrating a configuration of the semiconductor device 300*k* according to the eleventh embodiment.

The correction circuit 381*k* is connected to the bias line NN on a non-inversion side and the bias line NNB on an inversion side in the differential amplifier circuit 310, shares the transfer circuit 13 with the differential amplifier circuit 310, and is configured using a differential amplifier. In the correction circuit 381*k*, a noise component included in a signal transferred from the bias line NN on the non-inversion side to the input node on the inversion side and a noise component included in a signal transferred from the bias line NNB on the inversion side to the input node on the non-inversion side can have amplitudes close to each other with the same polarity. As a result, the correction circuit 381*k* takes a difference between a signal of the bias line NN and a signal of the bias line NNB, and supplies a difference signal VO381*k* of which noise component has been reduced to a node 391*k*1 in the connection circuit 391*k*.

The correction circuit 372*k* is connected to the bias line NP on the non-inversion side and the bias line NPB on the inversion side in the differential amplifier circuit 320, shares the transfer circuit 23 with the differential amplifier circuit 320, and is configured using a differential amplifier. In the correction circuit 372*k*, a noise component included in a signal transferred from the bias line NP on the non-inversion side to the input node on the inversion side and a noise component included in a signal transferred from the bias line NPB on the inversion side to the input node on the non-inversion side can have amplitudes close to each other with the same polarity. As a result, the correction circuit 372*k* takes a difference between a signal of the bias line NP and a signal of the bias line NPB, and supplies a difference signal VO372*k* of which noise component has been reduced to a node 392*k*2 in the connection circuit 392*k*.

The connection circuit 391*k* includes a line that connects an output node of the correction circuit 381*k* (differential amplifier), an output node of the correction circuit 372*k* (differential amplifier), and an input node of the level shifter 250*k*. The connection circuit 391*k* combines the difference signal VO381*k* received through the node 391*k*1 and the difference signal VO372*k* received through the node 391*k*2, and supplies the combined signal to the level shifter 250*k* through a node 391*k*3.

In the level shifter 250k, a series connection of inverters IV41 and IV42 is added between the node 391k3, and the inverters IV5 and IV7 with respect to the level shifter 250 (see FIG. 6). The level shifter 250k shifts a level of the signal received from connection circuit 391k and transfers the signal to output circuit 230.

The correction circuit 371k is connected to the bias line NN on the non-inversion side and the bias line NNB on the inversion side in the differential amplifier circuit 310, shares the transfer circuit 14 with the differential amplifier circuit 310, and is configured using a differential amplifier. In the correction circuit 371k, a noise component included in a signal transferred from the bias line NN on the non-inversion side to the input node on the inversion side and a noise component included in a signal transferred from the bias line NNB on the inversion side to the input node on the non-inversion side can have amplitudes close to each other with the same polarity. As a result, the correction circuit 371k takes a difference between a signal of the bias line NN and a signal of the bias line NNB, and supplies a difference signal VO371k of which noise component has been reduced to a node 392k1 in the connection circuit 392k.

The correction circuit 382k is connected to the bias line NP on the non-inversion side and the bias line NPB on the inversion side in the differential amplifier circuit 320, shares the transfer circuit 23 with the differential amplifier circuit 320, and is configured using a differential amplifier. In the correction circuit 382k, a noise component included in a signal transferred from the bias line NP on the non-inversion side to the input node on the inversion side and a noise component included in a signal transferred from the bias line NPB on the inversion side to the input node on the non-inversion side can have amplitudes close to each other with the same polarity. As a result, the correction circuit 382k takes a difference between a signal of the bias line NP and a signal of the bias line NPB, and supplies a difference signal VO382k of which noise component has been reduced to a node 392k2 in the connection circuit 392k.

The connection circuit 392k includes a line that connects an output node of the correction circuit 371k (differential amplifier), an output node of the correction circuit 382k (differential amplifier), and an input node of the level shifter 350k. The connection circuit 392k combines the difference signal VO371k received through the node 392k1 and the difference signal VO382k received through the node 392k2, and supplies the combined signal to the level shifter 350k through a node 392k3.

The level shifter 350k has a configuration similar to that of the level shifter 250k. The level shifter 350k shifts a level of the signal received from the connection circuit 392k and transfers the signal to the output circuit 330.

As described above, in the eleventh embodiment, the correction circuits 371k, 372k, 381k, and 382k take two sets of the difference between two signals corrected such that noise components are included with the same polarity for the differential amplifier circuits 310 and 320 having the opposite polarities and generate two sets of two difference signals, in the semiconductor device 300k. The connection circuits 391k and 392k combine the two difference signals in each set. As a result, it is possible to further suppress the influence of the noise components in the semiconductor device 300i, and it is possible to improve a noise removal ratio of the semiconductor device 300i. In addition, the influence of manufacturing variations and the like can be suppressed, a duty ratio of an output signal can be kept within an appropriate range (for example, a range around the duty ratio of 50%), and the duty ratio of the output signal can be improved.

Twelfth Embodiment

Next, a semiconductor device according to a twelfth embodiment will be described. Hereinafter, portions different from those of the first to eleventh embodiments will be mainly described.

The semiconductor device 300k illustrated in FIG. 13 performs the noise component reduction, obtained by taking the difference between two signals corrected such that the noise component is included with the same polarity, using the fully differential configuration, but the noise component reduction can be also applied to a single-ended configuration.

Figure 15:
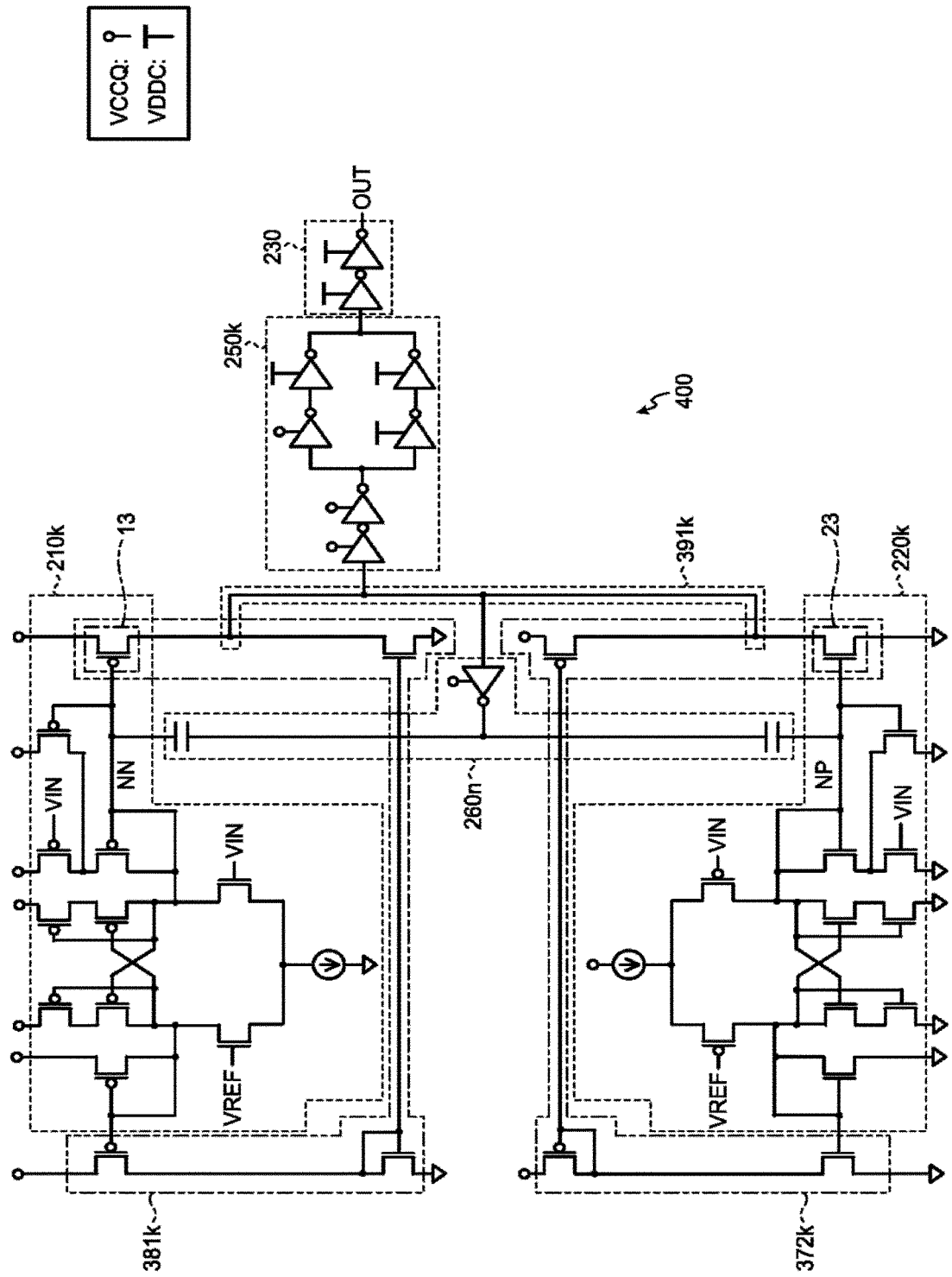
FIG. 15 is a circuit diagram illustrating a configuration of a semiconductor device according to a twelfth embodiment.

Based on such a concept, a semiconductor device 400 according to the twelfth embodiment is configured as illustrated in FIG. 15. FIG. 15 is a circuit diagram illustrating a configuration of the semiconductor device 400 according to the twelfth embodiment.

The semiconductor device 400 is configured by adding the correction circuits 372k and 381k and the connection circuit 391k illustrated in FIG. 14 to the configuration illustrated in FIG. 10, and replacing the level shifter 250 with the level shifter 250k illustrated in FIG. 14. Operations of the correction circuits 372k and 381k, the connection circuit 391k, and the level shifter 250k are similar to those of the eleventh embodiment.

In addition, the semiconductor device 400 has a more symmetric configuration as compared with the configuration illustrated in FIG. 14, and can output a signal while avoiding the influence of a delay difference between an inversion side and a non-inversion side.

As described above, in the twelfth embodiment, the correction circuits 372k and 381k take a difference between two signals corrected such that noise components are included with the same polarity for the differential amplifier circuits 310 and 320 having the opposite polarities and generate two difference signals, in the semiconductor device 400. The connection circuit 391k combines the two difference signals. As a result, it is possible to further suppress the influence of the noise components in the semiconductor device 400, and it is possible to improve a noise removal ratio of the semiconductor device 400. In addition, the influence of manufacturing variations and the like can be suppressed, a duty ratio of an output signal can be kept within an appropriate range (for example, a range around the duty ratio of 50%), and the duty ratio of the output signal can be improved.

Figure 16:
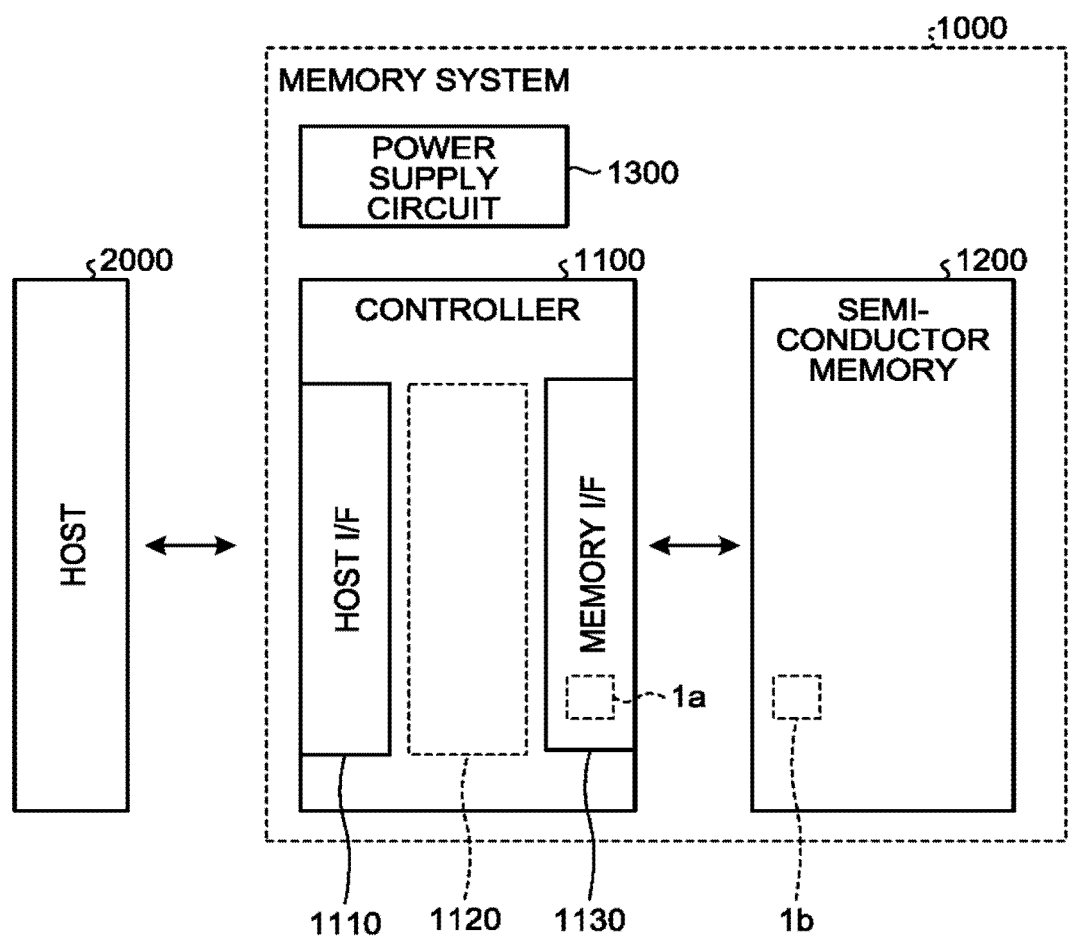
FIG. 16 is a block diagram illustrating a configuration of a memory system to which the semiconductor devices according to the first to twelfth embodiments and the modification thereof are applicable.

Next, a memory system 1000 to which the semiconductor devices according to the first to twelfth embodiments are applied will be described with reference to FIG. 16. FIG. 16 is a diagram illustrating a configuration of the memory system 1000 to which the semiconductor devices according to the first to twelfth embodiments are applied.

The memory system 1000 can be connected to a host 2000 and can function as an external storage medium of the host 2000. The host 2000 is, for example, a personal computer, and the memory system 1000 is, for example, an SSD. The memory system 1000 includes a controller 1100, a semiconductor memory 1200, and a power supply circuit 1300. The controller 1100 is a circuit as hardware, and includes a host interface circuit (host I/F) 1110, a signal processing circuit 1120, and a memory interface circuit (memory I/F) 1130. The power supply circuit 1300 generates a plurality of types of power supply voltages (for example, the power supply voltages VCCQ and VDDC, and the like) and supplies the generated voltages to each unit in the memory system 1000.

For example, the semiconductor memory 1200 includes a semiconductor device 1*b* as a receiver. The memory I/F 1130 receives a predetermined signal from the signal processing circuit 1120 and transfers the signal to the semiconductor device 1*b*. The semiconductor device 1*b* operates using the power supply circuit 1300 (for example, the power supply voltages VCCQ and VDDC, and the like) received from the power supply circuit 1300, and receives the signal transferred from the memory I/F 1130. The semiconductor device 1*b* supplies the received signal to the semiconductor memory 1200.

Such a signal may be, for example, a single end signal such as write data, a reference potential, a chip select signal (CE), a command latch enable signal (CLE), an address latch enable signal (ALE), a write enable signal (WE), and a write protect signal (WP). In this case, any of the semiconductor devices according to the first to seventh embodiments and the twelfth embodiment can be applied to the semiconductor device 1*b*.

Alternatively, such a signal may be, for example, a differential signal such as a data strobe signal (DQS/BDQS) at the time of write and a read enable signal (RE/BRE). In this case, any of the semiconductor devices according to the eighth to eleventh embodiments can be applied to the semiconductor device 1*b*.

The memory I/F 1130 includes a semiconductor device 1*a* as a receiver. The semiconductor memory 1200 transfers a predetermined signal to the semiconductor device 1*a*. The semiconductor device 1*a* operates using the power supply circuit 1300 (for example, the power supply voltages VCCQ and VDDC, and the like) received from the power supply circuit 1300, and receives the signal transferred from the semiconductor memory 1200. The semiconductor device 1*a* supplies the received signal to the signal processing circuit 112.

Such a signal may be, for example, a single end signal such as a read data, and a ready/busy signal (R/B). In this case, any of the semiconductor devices according to the first to seventh embodiments and the twelfth embodiment can be applied to the semiconductor device 1*a*.

Alternatively, such a signal may be, for example, a differential signal such as a data strobe signal (DQS/BDQS) at the time of read. In this case, any of the semiconductor devices according to the eighth to eleventh embodiments can be applied to the semiconductor device 1*a*.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising a first differential amplifier circuit,
   wherein the first differential amplifier circuit includes:
   a first transistor;
   a second transistor of which gate and drain are connected to the first transistor;
   a third transistor diode-connected through the first transistor or diode-connected without passing through the first transistor;
   a fourth transistor diode-connected through the second transistor or diode-connected without passing through the second transistor;
   a fifth transistor which forms a first current mirror circuit with the third transistor; and
   a sixth transistor which is connected to a drain of the first transistor in parallel with the third transistor and which forms a second current mirror circuit with the fifth transistor.

2. The semiconductor device according to claim 1, wherein
   the third transistor is diode-connected through the first transistor, and
   the fourth transistor is diode-connected through the second transistor.

3. The semiconductor device according to claim 2, wherein
   a gate of the first transistor is connected to a gate of the fourth transistor and the drain of the second transistor, and
   the gate of the second transistor is connected to a gate of the third transistor and the drain of the first transistor.

4. The semiconductor device according to claim 1, wherein
   the third transistor is diode-connected without passing through the first transistor, and
   the fourth transistor is diode-connected without passing through the second transistor.

5. The semiconductor device according to claim 4, wherein
   a gate of the first transistor is connected to a gate and a drain of the fourth transistor, and
   the gate of the second transistor is connected to a gate and a drain of the third transistor.

6. The semiconductor device according to claim 1, wherein
   the first differential amplifier circuit further includes:
   a seventh transistor which is connected in series to the sixth transistor and which receives a first input signal at a gate; and
   an eighth transistor connected to the drain of the second transistor in parallel with the fourth transistor.

7. The semiconductor device according to claim 6, wherein
   the first differential amplifier circuit further includes
   a ninth transistor which forms a differential pair with the seventh transistor, which is connected in series to the eighth transistor at a source, and which receives a reference signal at a gate.

8. The semiconductor device according to claim 6, wherein
   the first differential amplifier circuit further includes
   a ninth transistor which forms a differential pair with the seventh transistor, which is connected in series to the eighth transistor at a source, and which receives a second input signal logically inverted from the first input signal at a gate.

9. The semiconductor device according to claim 7 further comprising
   a potential adjustment circuit connected to a source of the sixth transistor.

10. The semiconductor device according to claim 9, wherein
    the potential adjustment circuit includes a tenth transistor which is connected to the source of the sixth transistor in parallel with the seventh transistor and which is diode-connected through the sixth transistor.

11. The semiconductor device according to claim 9 further comprising
a second potential adjustment circuit connected to a source of the eighth transistor.

12. The semiconductor device according to claim 11, wherein
the second potential adjustment circuit includes
an eleventh transistor which is connected to a source of the eighth transistor in parallel with the ninth transistor and which is diode-connected through the eighth transistor.

13. The semiconductor device according to claim 8, wherein
the first differential amplifier circuit further includes
a twelfth transistor which forms a third current mirror circuit with the fourth transistor and which forms a fourth current mirror circuit with the eighth transistor, and
the first differential amplifier circuit generates a first output signal in response to a signal transferred through the fifth transistor, and generates a second output signal logically inverted from the first output signal in response to a signal transferred through the twelfth transistor.

14. The semiconductor device according to claim 1, wherein
the first differential amplifier circuit further includes:
a first input transistor which is connected to the drain of the first transistor and which receives a first input signal at a gate;
a second input transistor which is connected to the drain of the second transistor and which receives a reference signal at a gate; and
a variable current circuit which is connected to a source of the first input transistor and a source of the second input transistor and which changes a current amount in accordance with a polarity of the first input signal.

15. The semiconductor device according to claim 1, further comprising:
a first inverter which has an input node connected to a source of the fifth transistor; and
a first capacitive element which has one end connected to an output node of the first inverter and another end connected to a line connecting a gate of the fifth transistor and a gate of the sixth transistor.

16. The semiconductor device according to claim 1, further comprising
a second differential amplifier circuit of which polarity is inverted from a polarity of the first differential amplifier circuit,
wherein the first differential amplifier circuit includes:
a first input transistor which is connected to the drain of the first transistor and which receives a first input signal at a gate; and
a second input transistor which is connected to the drain of the second transistor and which receives a reference signal at a gate, and
the second differential amplifier circuit includes:
a thirteenth transistor;
a fourteenth transistor of which gate and drain are connected to the thirteenth transistor;
a fifteenth transistor diode-connected through the thirteenth transistor;
a sixteenth transistor diode-connected through the fourteenth transistor;
a seventeenth transistor which forms a fifth current mirror circuit with the fifteenth transistor;
an eighteenth transistor which is connected to a drain of the thirteenth transistor in parallel with the fifteenth transistor and which forms a sixth current mirror circuit with the seventeenth transistor;
a third input transistor which is connected to the drain of the thirteenth transistor and which receives the first input signal at a gate; and
a fourth input transistor which is connected to a drain of the fourteenth transistor and which receives the reference signal at a gate.

17. The semiconductor device according to claim 16, further comprising:
a first inverter which has an input node connected to a source of the fifth transistor and a source of the seventeenth transistor;
a first capacitive element which has one end connected to an output node of the first inverter and another end connected to a line connecting a gate of the fifth transistor and a gate of the sixth transistor; and
a second capacitive element which has one end connected to the output node of the first inverter and another end connected to a line connecting a gate of the seventeenth transistor and a gate of the fifteenth transistor.

18. The semiconductor device according to claim 13, further comprising
a second differential amplifier circuit of which polarity is inverted from a polarity of the first differential amplifier circuit,
wherein the first differential amplifier circuit includes:
a first input transistor which is connected to the drain of the first transistor and which receives a first input signal at a gate; and
a second input transistor which is connected to the drain of the second transistor and which receives a reference signal at a gate, and
the second differential amplifier circuit includes:
a thirteenth transistor;
a fourteenth transistor of which gate and drain are connected to the thirteenth transistor;
a fifteenth transistor diode-connected through the thirteenth transistor;
a sixteenth transistor diode-connected through the fourteenth transistor;
a seventeenth transistor which forms a fifth current mirror circuit with the fifteenth transistor;
an eighteenth transistor which is connected to a drain of the thirteenth transistor in parallel with the fifteenth transistor and which forms a sixth current mirror circuit with the seventeenth transistor;
a nineteenth transistor which forms a seventh current mirror circuit with the sixteenth transistor;
a twentieth transistor which is connected to a drain of the fourteenth transistor in parallel with the sixteenth transistor and which forms an eighth current mirror circuit with the nineteenth transistor;
a third input transistor which is connected to a drain of the thirteenth transistor and which receives the first input signal at a gate; and
a fourth input transistor which is connected to a drain of the fourteenth transistor and which receives the reference signal at a gate.

19. The semiconductor device according to claim 18, further comprising:

a first inverter which has an input node connected to a source of the fifth transistor and a source of the seventeenth transistor;
a first capacitive element which has one end connected to an output node of the first inverter and another end connected to a line connecting a gate of the fifth transistor and a gate of the sixth transistor;
a second capacitive element which has one end connected to the output node of the first inverter and another end connected to a line connecting a gate of the seventeenth transistor and a gate of the fifteenth transistor;
a second inverter which has an input node connected to a source of the twelfth transistor and a source of the nineteenth transistor;
a third capacitive element which has one end connected to an output node of the second inverter and another end connected to a line connecting a gate of the twelfth transistor and a gate of the eighth transistor; and
a fourth capacitive element which has one end connected to the output node of the second inverter and another end connected to a line connecting a gate of the nineteenth transistor and a gate of the sixteenth transistor.

20. A memory system comprising:
a receiver which includes the semiconductor device according to claim 1; and
a semiconductor memory which operates using the receiver.

* * * * *